US012046484B2

(12) United States Patent
Choi

(10) Patent No.: US 12,046,484 B2
(45) Date of Patent: Jul. 23, 2024

(54) MODULE FOR REMOVING MIS-ASSEMBLED SEMICONDUCTOR LIGHT-EMITTING ELEMENT AND METHOD FOR REMOVING MIS-ASSEMBLED SEMICONDUCTOR LIGHT-EMITTING ELEMENT BY USING SAME

(71) Applicant: LG ELECTRONICS INC., Seoul (KR)

(72) Inventor: Juchan Choi, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 379 days.

(21) Appl. No.: 17/627,110

(22) PCT Filed: Jul. 16, 2019

(86) PCT No.: PCT/KR2019/008798
§ 371 (c)(1),
(2) Date: Jan. 13, 2022

(87) PCT Pub. No.: WO2021/010521
PCT Pub. Date: Jan. 21, 2021

(65) Prior Publication Data
US 2022/0254657 A1    Aug. 11, 2022

(51) Int. Cl.
*H01L 33/00* (2010.01)
*H01L 21/66* (2006.01)
(Continued)

(52) U.S. Cl.
CPC ........ *H01L 21/67017* (2013.01); *H01L 22/22* (2013.01); *H01L 25/0753* (2013.01);
(Continued)

(58) Field of Classification Search
None
See application file for complete search history.

(56) References Cited

U.S. PATENT DOCUMENTS 5,355,577 A    10/1994 Cohn
10,446,728 B2 * 10/2019 Sasaki ................... H01L 24/799
(Continued)

FOREIGN PATENT DOCUMENTS

JP    2005-209772    8/2005
JP    2018-041876    3/2018
(Continued)

OTHER PUBLICATIONS

PCT International Application No. PCT/KR2019/008798, International Search Report dated Jul. 16, 2019, 8 pages.

*Primary Examiner* — Bradley Smith
(74) *Attorney, Agent, or Firm* — LEE, HONG, DEGERMAN, KANG & WAIMEY

(57) ABSTRACT

According to an embodiment of the present invention, a removal module using an electric field and a magnetic field so as to self-assemble, on cells arranged in a matrix form of an assembly substrate, semiconductor light-emitting elements introduced in a fluid accommodated in a chamber, and then remove a semiconductor light-emitting element mis-assembled with the assembly substrate comprises: a fluid supply unit for supplying the fluid; and a housing of which one side is connected to the fluid supply unit, an upper plate is adjacent to the assembly substrate, and a lower plate is adjacent to the chamber, wherein the upper plate has: a nozzle hole allowing communication between the inner space of the housing and the inner space of the chamber so that the fluid supplied from the fluid supply unit is injected at a site in which the semiconductor light-emitting element is mis-assembled on the assembly substrate; and one pair of (Continued)

partition parts facing each other with the nozzle hole as the center thereof.

12 Claims, 18 Drawing Sheets

(51) Int. Cl.
    *H01L 21/67*         (2006.01)
    *H01L 25/075*      (2006.01)
    *H01L 21/68*         (2006.01)

(52) U.S. Cl.
    CPC ...... *H01L 21/67259* (2013.01); *H01L 21/681* (2013.01); *H01L 33/007* (2013.01); *H01L 33/0075* (2013.01); *H01L 33/0093* (2020.05)

(56) References Cited

U.S. PATENT DOCUMENTS

2017/0372927 A1* 12/2017 Schuele ............... H01L 29/0657
2022/0406748 A1* 12/2022 Choi ....................... H01L 24/98

FOREIGN PATENT DOCUMENTS

| KR | 10-2018-0011404 | 2/2018 |
| KR | 10-2019-0009003 | 1/2019 |
| KR | 10-2020-0026689 | 3/2020 |

* cited by examiner

FIG. 10
(a) 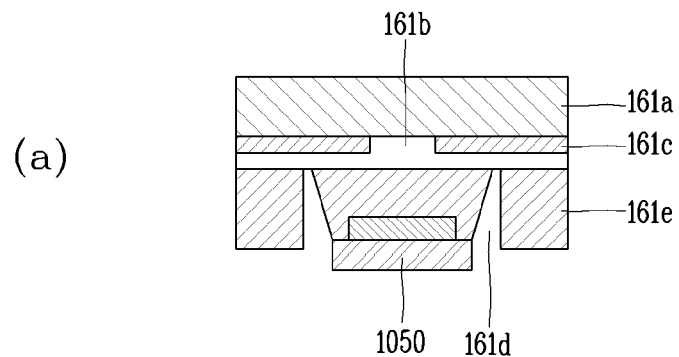
(b) 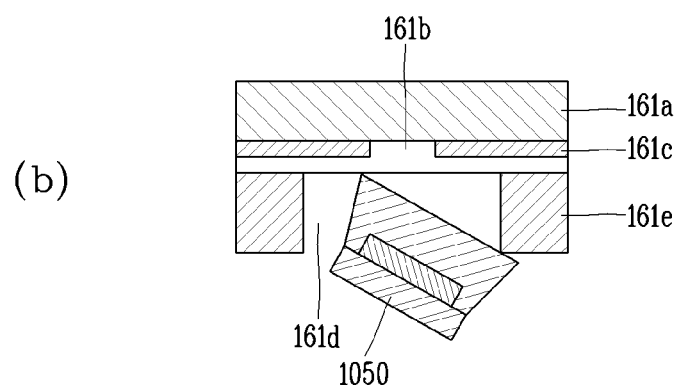
(c) 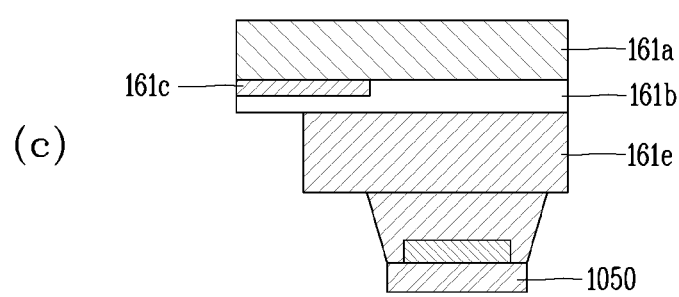
(d) 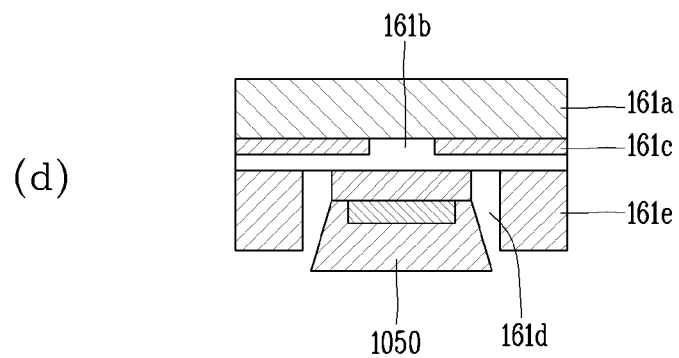

FIG. 11
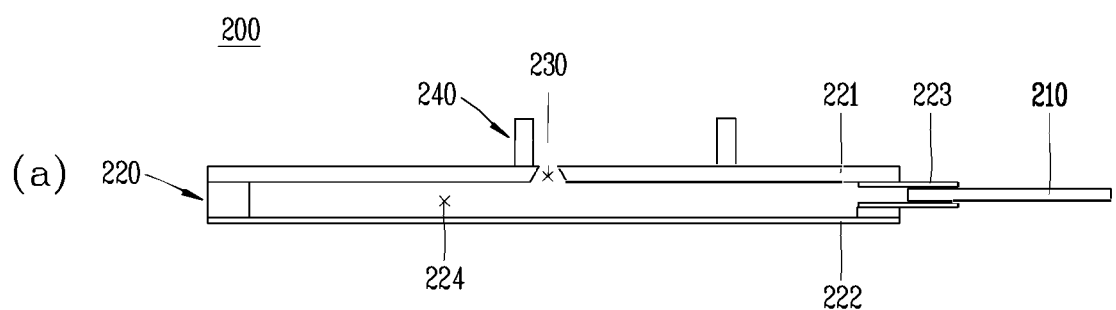
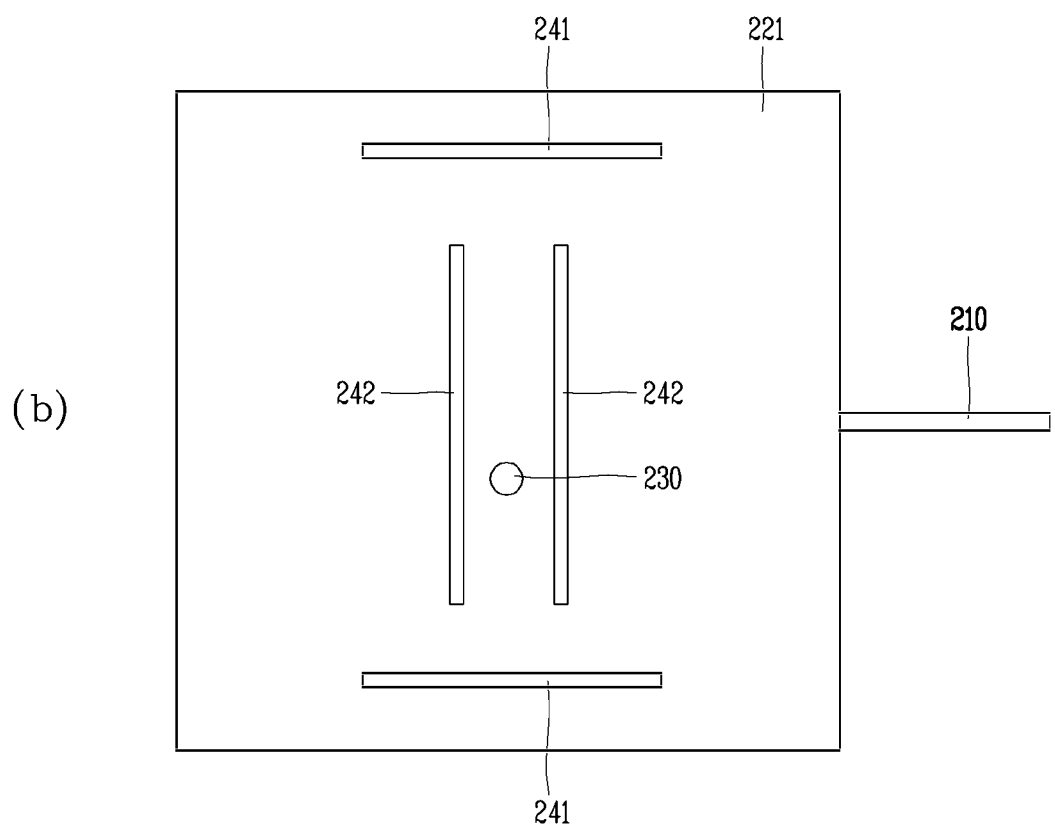

FIG. 12
(a)
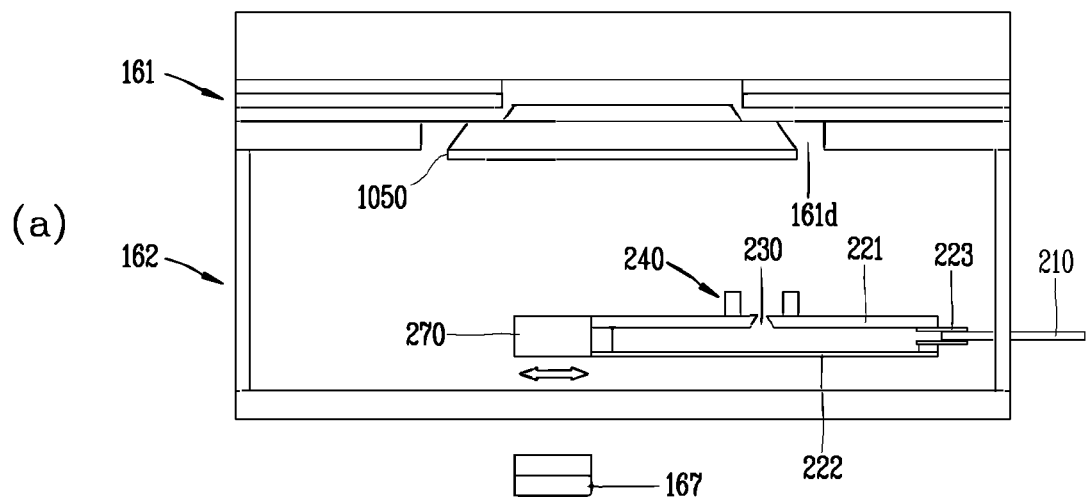
(b)
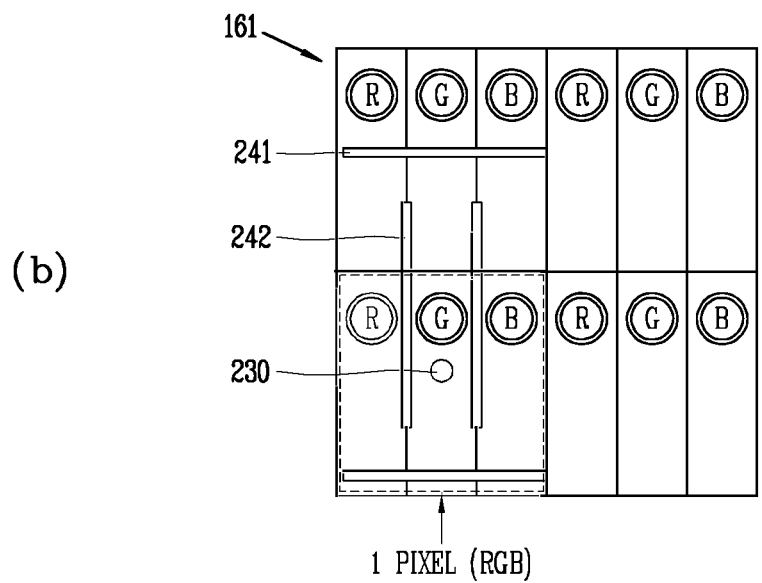
1 PIXEL (RGB)

FIG. 14
(a)
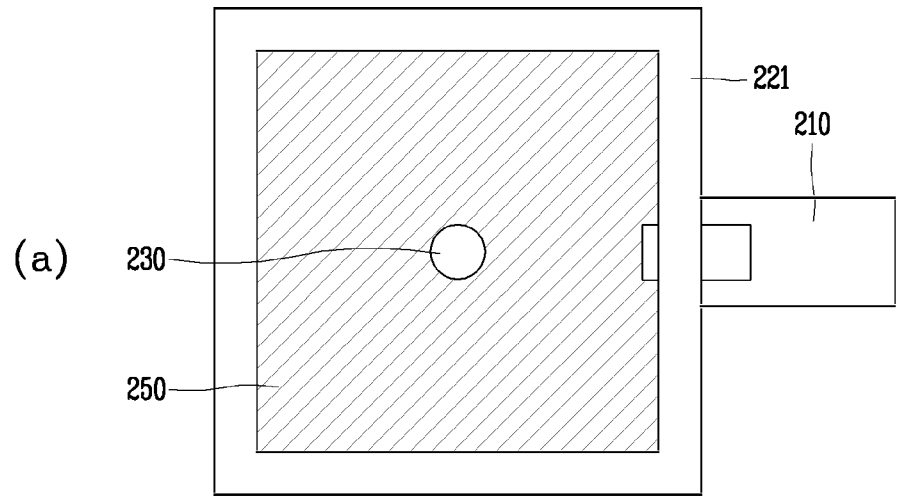
(b)
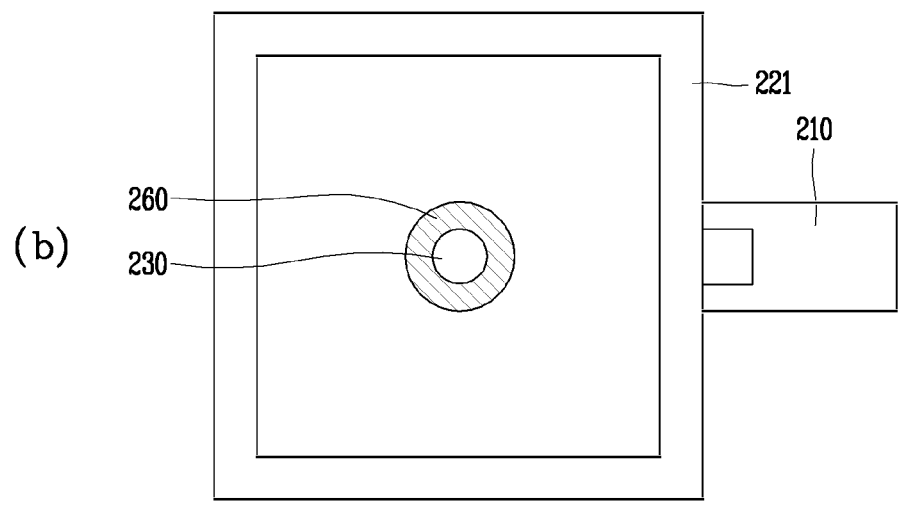

MODULE FOR REMOVING MIS-ASSEMBLED SEMICONDUCTOR LIGHT-EMITTING ELEMENT AND METHOD FOR REMOVING MIS-ASSEMBLED SEMICONDUCTOR LIGHT-EMITTING ELEMENT BY USING SAME

CROSS-REFERENCE TO RELATED APPLICATIONS

This application is the National Stage filing under 35 U.S.C. 371 of International Application No. PCT/KR2019/008798, filed on Jul. 16, 2019, the contents of which are hereby incorporated by reference herein its entirety.

TECHNICAL FIELD

This specification relates to a module for removing a mis-assembled semiconductor light-emitting element that is used for manufacturing a display device using semiconductor light-emitting elements having sizes of several to several tens of μm, and a method for removing a mis-assembled semiconductor light-emitting element using the same.

BACKGROUND ART

In recent years, in the field of display technology, liquid-crystal displays (LCDs), organic light-emitting diodes (OLED) displays, microLED displays, etc. have been competing to realize large-area displays.

However, LCDs have problems such as slow response time and low efficiency of light produced by a backlight, and OLEDs have disadvantages such as short lifetime, low mass-production yield, and low efficiency.

On the contrary, semiconductor light-emitting diodes (microLEDs) with a diameter or cross-sectional area less than 100 μm, when used in displays, may offer very high efficiency because the displays do not need a polarizer to absorb light. However, large-scale displays require several millions of semiconductor light-emitting diodes, which makes it difficult to transfer the devices compared to other technologies.

Some of the technologies currently in development for the transfer process include pick & place, laser lift-off (LLO), and self-assembly. Among these technologies, the self-assembly approach is a method that allows semiconductor light-emitting diodes to find their positions on their own in a fluid, which is most advantageous in realizing large-screen display devices.

However, a method is required to solve the problem of mis-assembly of the semiconductor light-emitting elements having the sizes of micro meters. Especially, for a self-assembly that is carried out under a special assembly environment (e.g., an assembly in a fluid, a narrow assembly space, etc.), a method for removing a mis-assembled semiconductor light-emitting element is required.

DISCLOSURE OF INVENTION

Technical Problem

The present disclosure describes a module for selectively removing a semiconductor light-emitting element having a size of several to several tens of μm that is mis-assembled to an assembly substrate in a fluid, and a method for removing a semiconductor light-emitting element mis-assembled to an assembly substrate using the same.

Solution to Problem

In order to achieve these and other advantages and in accordance with the purpose of this specification, as embodied and broadly described herein, there is provided a module for removing a semiconductor light-emitting element mis-assembled on an assembly substrate, after semiconductor light-emitting elements introduced into a fluid accommodated in a chamber are self-assembled in cells of the assembly substrate arranged in a matrix form by using an electrical field and a magnetic field, the module including a fluid supply unit to supply a fluid, and a housing having one side connected to the fluid supply unit and including an upper plate adjacent to the assembly substrate and a lower plate adjacent to the chamber. The upper plate may include a nozzle hole allowing communication between an inner space of the housing and an inner space of the chamber to inject the fluid supplied from the fluid supply unit to a site in which the semiconductor light-emitting element is mis-assembled on the assembly substrate, and a pair of partition parts facing each other with the nozzle hole as a center thereof.

In some implementations, the partition parts may include a pair of first partition parts extending in a row direction of the semiconductor light-emitting elements arranged on the assembly substrate, and a pair of second partition parts extending in a column direction of the semiconductor light-emitting elements arranged on the assembly substrate.

In some implementations, the first partition parts may have an interval equal to or narrower than an interval between the semiconductor light-emitting elements in the column direction, and the second partition parts may have an interval equal to or narrower than an interval between the semiconductor light-emitting elements in the row direction.

In some implementations, the first partition parts may extend longer than at least a length of the cells in the row direction, and the second partition parts may extend longer than at least a length of the cells in the column direction.

In some implementations, the upper plate may include a first surface facing the assembly substrate, and a second surface facing the inner space of the housing and convex toward the first surface.

The nozzle hole may allow the communication between the inner space of the housing and the inner space of the chamber through a highest point of the second surface.

In some implementations, the upper plate may further include a color filter having a fine hole formed at a position corresponding to the nozzle hole.

In some implementations, the upper plate may further include a metal thin film layer formed along a circumference of the nozzle hole.

In some implementations, the module may further include a transfer unit to transfer the housing to correspond to a position of the semiconductor light-emitting element mis-assembled on the assembly substrate.

The present disclosure further describes a method for removing a mis-assembled semiconductor light-emitting element that is performed after placing semiconductor light-emitting elements introduced into a fluid in preset positions of an assembly substrate using an electric field and a magnetic field. The method may include capturing an image or video of one surface of the assembly substrate on which the semiconductor light-emitting elements are placed, identifying from the captured image or video whether the semiconductor light-emitting elements are mis-assembled and coordinates of a position of a mis-assembled semiconductor light-emitting element, aligning the removal module below a point corresponding to the identified coordinates, and removing the mis-assembled semiconductor light-emitting elements from the assembly substrate by injecting a fluid toward the position where the semiconductor light-emitting element is mis-assembled.

In some implementations, the aligning the removal module below the point corresponding to the identified coordinates may include horizontally moving the removal module so that the identified coordinates correspond to the nozzle hole for injecting the fluid, and vertically moving the removal module such that one end of each partition part becomes close to one surface of the assembly substrate.

In some implementations, when there are a plurality of mis-assembled semiconductor light-emitting elements, the removal module may calculate a shortest path based on coordinates of each of the mis-assembled semiconductor light-emitting elements and move along the calculated shortest path.

In some implementations, when there are a plurality of mis-assembled semiconductor light-emitting elements, the removal module may be provided in plurality to be aligned below points corresponding to respectively confirmed coordinates, so as to simultaneously remove the mis-assembled semiconductor light-emitting elements.

Advantageous Effects of Invention

A module for removing a mis-assembled semiconductor light-emitting element according to an implementation can be disposed within a fluid chamber to selectively remove a mis-assembled semiconductor light-emitting element by injecting a fluid onto a specific site of an assembly substrate on which semiconductor light-emitting elements having a size of several to several tens of μm are self-assembled at intervals of several tens to several hundreds of μm.

In particular, since a mis-assembly site is isolated from adjacent cells by partition parts of the removal module, semiconductor light-emitting elements that are normally assembled at adjacent regions can be prevented from being separated due to a fluid injected through a nozzle hole.

BRIEF DESCRIPTION OF DRAWINGS

FIG. 10 is a view illustrating mis-assembly types upon self-assembly.

FIG. 11 is a view illustrating a removal module in accordance with one implementation.

FIG. 12 is a view illustrating a removal module applied to a self-assembly device (fluid chamber).

FIG. 14 is a view illustrating a removal module to which a color filter or a metal thin film layer is applied.

MODE FOR THE INVENTION

Description will now be given in detail according to exemplary embodiments disclosed herein, with reference to the accompanying drawings. For the sake of brief description with reference to the drawings, the same or equivalent components may be provided with the same or similar reference numbers, and description thereof will not be repeated. In general, a suffix such as "module" and "unit" may be used to refer to elements or components. Use of such a suffix herein is merely intended to facilitate description of the specification, and the suffix itself is not intended to give any special meaning or function. In describing the present disclosure, if a detailed explanation for a related known function or construction is considered to unnecessarily divert the gist of the present disclosure, such explanation has been omitted but would be understood by those skilled in the art. The accompanying drawings are used to help easily understand the technical idea of the present disclosure and it should be understood that the idea of the present disclosure is not limited by the accompanying drawings. It will be understood that when an element such as a layer, area or substrate is referred to as being "on" another element, it can be directly on the element, or one or more intervening elements may also be present.

A display device disclosed herein may include a mobile phone, a smart phone, a laptop computer, a digital broadcast terminal, a personal digital assistant (PDA), a portable multimedia player (PMP), a navigator, a slate PC, a tablet PC, an ultrabook, a digital TV, a desktop computer, and the like. However, the configuration according to the implementation described herein can be applied as long as it can include a display even of it is a new product form to be developed later.

Figure 1:
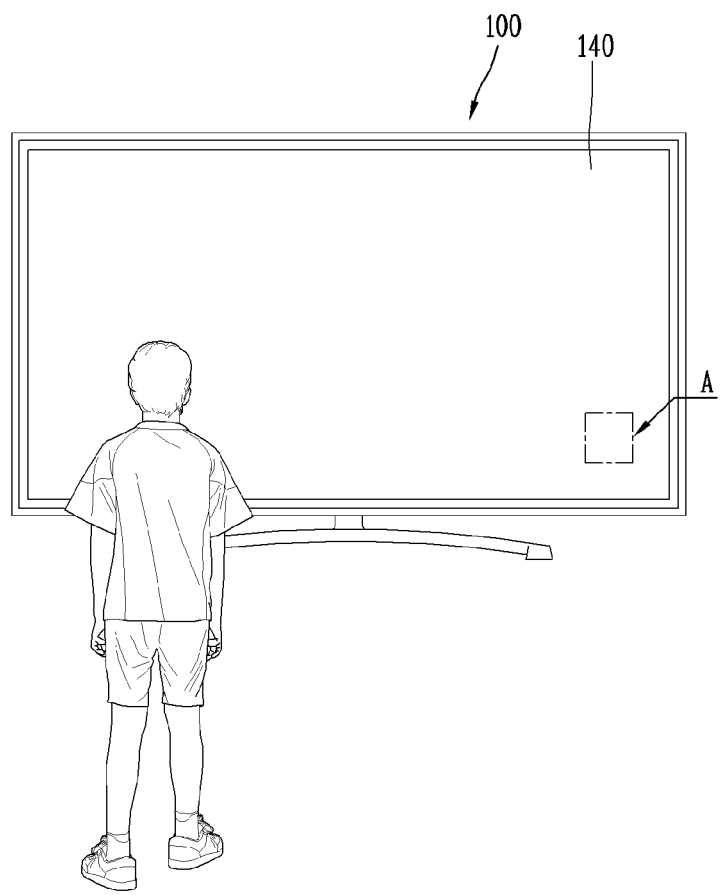
FIG. 1 is a conceptual view illustrating one implementation of a display device using semiconductor light-emitting elements.
Figure 2:
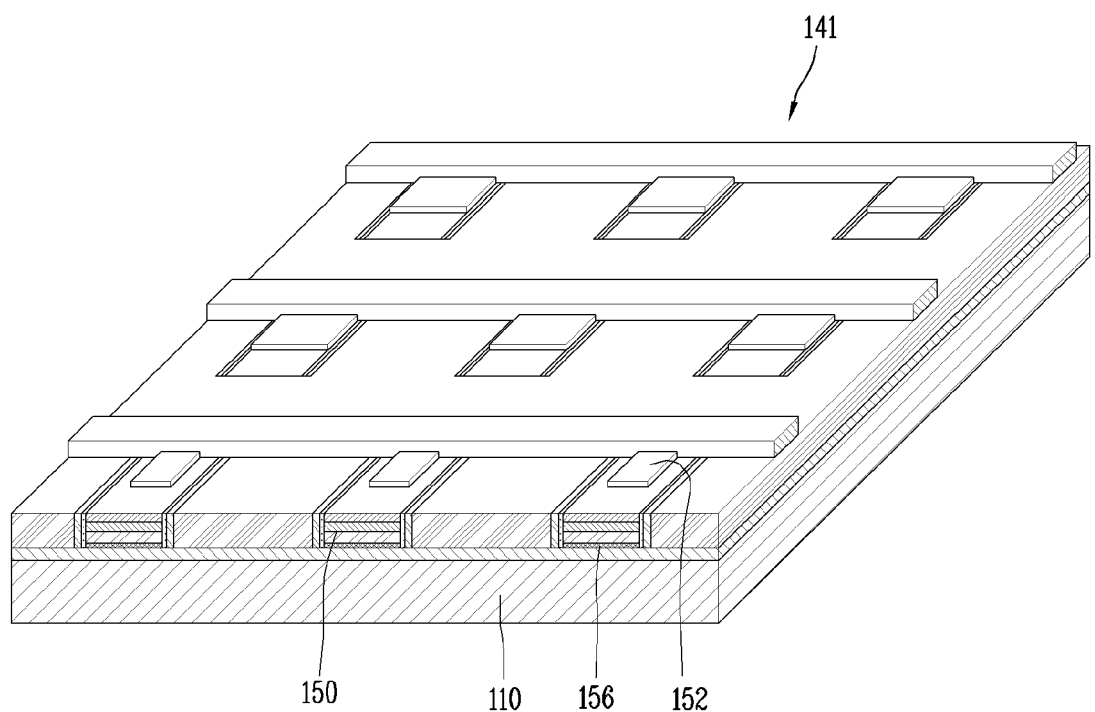
FIG. 2 is a partial enlarged view of the portion A in the display device of FIG. 1.
Figure 3:
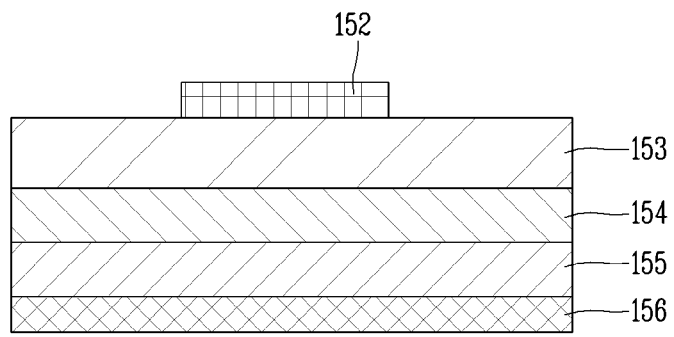
FIG. 3 is an enlarged view of the semiconductor light-emitting element of FIG. 2.
Figure 4:
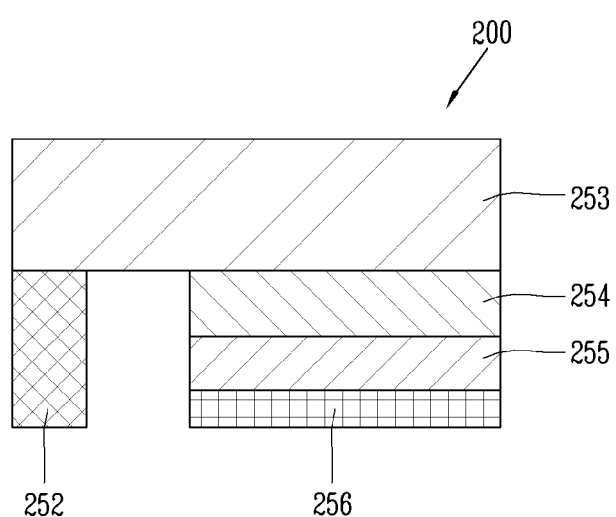
FIG. 4 is an enlarged view illustrating another implementation of the semiconductor light-emitting element of FIG. 2.

FIG. 1 is a conceptual view illustrating one implementation of a display device using semiconductor light-emitting elements, FIG. 2 is a partial enlarged view of the portion A in the display device of FIG. 1, FIG. 3 is an enlarged view of the semiconductor light-emitting element of FIG. 2, and FIG. 4 is an enlarged view illustrating another implementation of the semiconductor light-emitting element of FIG. 2.

As illustrated, information processed by a controller of a display device 100 may be output on a display module 140. A closed loop-shaped case that runs around the edge of the display module 140 may define the bezel of the display device.

The display module 140 may include a panel 141 that displays an image, and the panel 141 may include micro-sized semiconductor light-emitting elements (or diodes) 150 and a wiring substrate 110 where the semiconductor light-emitting elements 150 are mounted.

The wiring substrate 110 may be provided with wirings, which can be connected to n-type electrodes 152 and p-type electrodes 156 of the semiconductor light-emitting elements 150. As such, the semiconductor light-emitting elements 150 may be provided on the wiring substrate 110 as individual pixels that emit light on their own.

The image displayed on the panel 141 may be visual information, which is rendered by controlling the light emission of unit pixels (sub-pixels) arranged in a matrix configuration independently through the wirings.

The present disclosure takes microLEDs (light-emitting diodes) as an example of the semiconductor light-emitting elements 150 which convert current into light. The microLEDs may be light-emitting elements that are small in size less than 100 μm. The semiconductor light-emitting elements 150 may have light-emitting regions of red, green, and blue, and unit pixels may be produced by combinations of these colors. That is, the unit pixels are the smallest units for producing one color. Each unit pixel may contain at least three microLEDs.

More specifically, referring to FIG. 3, the semiconductor light-emitting element 150 may have a vertical structure.

For example, the semiconductor light-emitting elements 150 may be implemented as high-power light-emitting elements that are composed mostly of gallium nitride (GaN), with some indium (In) and/or aluminum (Al) added to it, and emit light of various colors.

Such a vertical semiconductor light-emitting element may include a p-type electrode 156, a p-type semiconductor layer 155 disposed on the p-type semiconductor layer 156, an active layer 154 disposed on the p-type semiconductor layer 155, an n-type semiconductor layer 153 disposed on the active layer 154, and an n-type electrode 152 disposed on the n-type semiconductor layer 153. In this case, the p-type electrode 156 at the bottom may be electrically connected to a p-electrode of the wiring substrate, and the upper n-type electrode 152 at the top may be electrically connected to an n-electrode above the semiconductor light-emitting element. The electrodes can be disposed in an upward/downward direction in the vertical semiconductor light-emitting element 150, thereby providing a great advantage of reducing a chip size.

In another example, referring to FIG. 4, the semiconductor light-emitting elements may be flip chip-type light-emitting elements.

As an example of such a flip chip-type light-emitting element, the semiconductor light-emitting element 250 may include a p-type electrode 256, a p-type semiconductor layer 255 disposed on the p-type layer 256, an active layer 254 disposed on the p-type semiconductor layer 255, an n-type semiconductor layer 253 disposed on the active layer 254, and an n-type electrode 252 vertically separated from the p-type electrode 256 on the n-type semiconductor layer 253. In this case, both the p-type electrode 256 and the n-type electrode 252 may be electrically connected to a p electrode and an n electrode of the wiring substrate, below the semiconductor light-emitting element.

The vertical semiconductor light-emitting element and a horizontal light-emitting element each may be used as a green semiconductor light-emitting element, blue semiconductor light-emitting element, or red semiconductor light-emitting element. The green semiconductor light-emitting element and the blue semiconductor light-emitting element may be implemented as high-power light-emitting elements that are composed mostly of gallium nitride (GaN), with some indium (In) and/or aluminum (Al) added to it, and emit green and blue light, respectively. As an example, the semiconductor light-emitting elements may be made of gallium nitride thin films which include various layers of n-Gan, p-GaN, AlGaN, InGaN, etc. More specifically, the p-type semiconductor layer may be P-type GaN, and the n-type semiconductor layer may be N-type GaN. However, for the red semiconductor light-emitting element, the p-type semiconductor layer may be P-type GaAs, and the n-type semiconductor layer may be N-type GaAs.

Moreover, the p-type semiconductor layer may be P-type GaN doped with Mg on the p electrode, and the n-type semiconductor layer may be N-type GaN doped with Si on the n electrode. In this case, the above-described semiconductor light-emitting elements may be semiconductor light-emitting elements without the active layer.

In some examples, referring to FIGS. 1 to 4, because of the very small size of the light-emitting elements, self-emissive, high-definition unit pixels may be arranged on the display panel, and therefore the display device can deliver high picture quality.

In the display device using the semiconductor light-emitting elements, semiconductor light-emitting elements may be grown on a wafer, formed through mesa and isolation, and used as individual pixels. In this case, the micro-sized semiconductor light-emitting elements 150 should be transferred onto a wafer, at preset positions on a substrate of the display panel. One of the transfer technologies available may be pick and place, but it has a low success rate and requires a lot of time. In another example, a number of diodes may be transferred at a time by using a stamp or roll, which, however, is not suitable for large-screen displays because of limited yields. The present disclosure proposes a new method and device for manufacturing a display device that can solve these problems.

To this end, a new method for manufacturing a display device will be described first below. FIGS. 5A to 5E are conceptual views illustrating a new process for manufacturing the semiconductor light-emitting elements (or diodes).

In this specification, a display device using passive matrix (PM) semiconductor light-emitting elements will be illustrated. It should be noted that the illustration given below is also applied to active matrix (AM) semiconductor light-emitting diodes. Also, although the illustration will be given of how horizontal semiconductor light-emitting elements are self-assembled, it may also be applied to self-assembling of vertical semiconductor light-emitting elements.

Figure 5A:
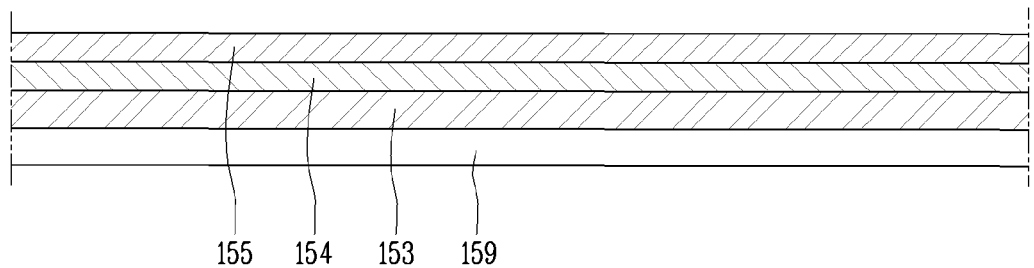
FIGS. 5A to 5E are conceptual diagrams illustrating a new process for manufacturing the semiconductor light-emitting element.

First of all, according to the manufacturing method, a first conductive semiconductor layer 153, an active layer 154, and a second conductive semiconductor layer 155 may be grown on a growth substrate 159 (FIG. 5A).

Once the first conductive semiconductor layer 153 is grown, the active layer 154 may be grown on the first conductive semiconductor layer 153 and then the second conductive semiconductor layer 155 may be grown on the active layer 154. By sequentially growing the first conductive semiconductor layer 153, the active layer 154, and the second conductive semiconductor layer 155, the first conductive semiconductor layer 153, the active layer 154, and the second conductive semiconductor layer 155 may form a stack structure as illustrated in FIG. 5A.

In this case, the first conductive semiconductor layer 153 may be a p-type semiconductor layer, and the second conductive semiconductor layer 155 may be an n-type semiconductor layer. However, the present disclosure is not necessarily limited to this, and the first conductive type may be n-type and the second conductive type may be p-type.

Moreover, although this exemplary embodiment is illustrated by assuming the presence of the active layer, the active layer may be omitted, if necessary, as stated above. In an example, the p-type semiconductor layer may be P-type GaN doped with Mg, and the n-type semiconductor layer may be N-type GaN doped with Si on the n electrode.

The growth substrate 159 (wafer) may be formed of, but not limited to, light-transmissive material, for example, one of sapphire (Al2O3), GaN, ZnO, and AlO. Also, the growth substrate 159 may be made of a material suitable for growing semiconductor materials, namely, a carrier wafer. The growth substrate 159 may be formed of a high thermal conducting material, and may be a conductive substrate or insulating substrate, for example, may use at least one of SiC, Si, GaAs, GaP, InP, and Ga2O3 substrates which have higher thermal conductivity than sapphire (Al2O3) substrates.

Figure 5B:
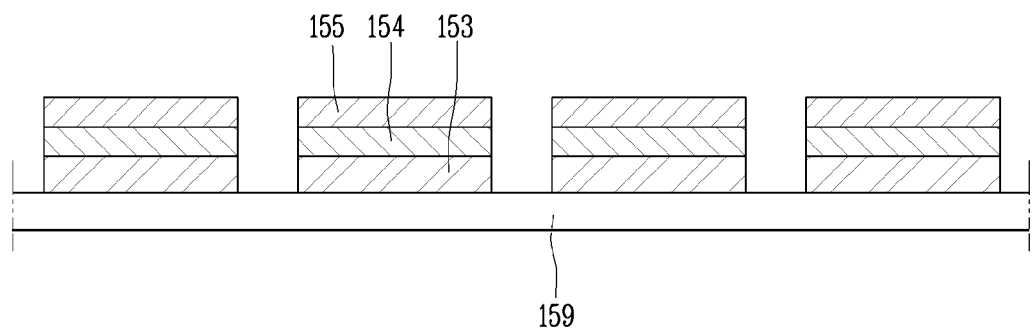

Next, a plurality of semiconductor light-emitting elements may be formed by removing at least parts of the first conductive semiconductor layer 153, the active layer 154, and the second conductive semiconductor layer 155 (FIG. 5B).

More specifically, isolation may be performed so that the plurality of light-emitting elements form a light-emitting diode array. That is, a plurality of semiconductor light-emitting elements may be formed by vertically etching the first conductive semiconductor layer 153, the active layer 154, and the second conductive semiconductor layer 155.

In the case of horizontal semiconductor light-emitting elements, a mesa process may be performed which exposes the first conductive semiconductor layer 153 to the outside by vertically removing part of the active layer 154 and the second conductive semiconductor layer 155, and then isolation may be performed which forms an array of semiconductor light-emitting elements by etching the first conductive semiconductor layer 153.

Figure 5C:
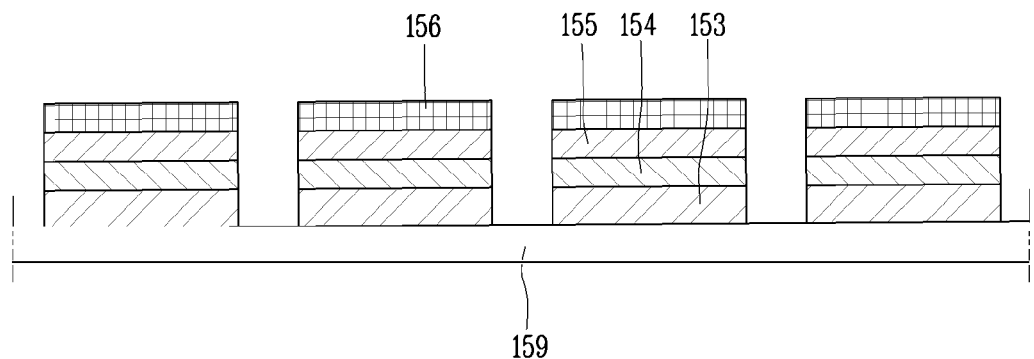

Next, a second conductive electrode 156 (or p-type electrode) may be formed on one surface of the second conductive semiconductor layer 155 (FIG. 5C). The second conductive electrode 156 may be formed by a deposition method such as sputtering, but the present disclosure is not necessarily limited to this. In a case where the first conductive semiconductor layer and the second conductive semiconductor layer are an n-type semiconductor layer and a p-type semiconductor layer, respectively, the second conductive electrode 156 may serve as an n-type electrode.

Figure 5D:
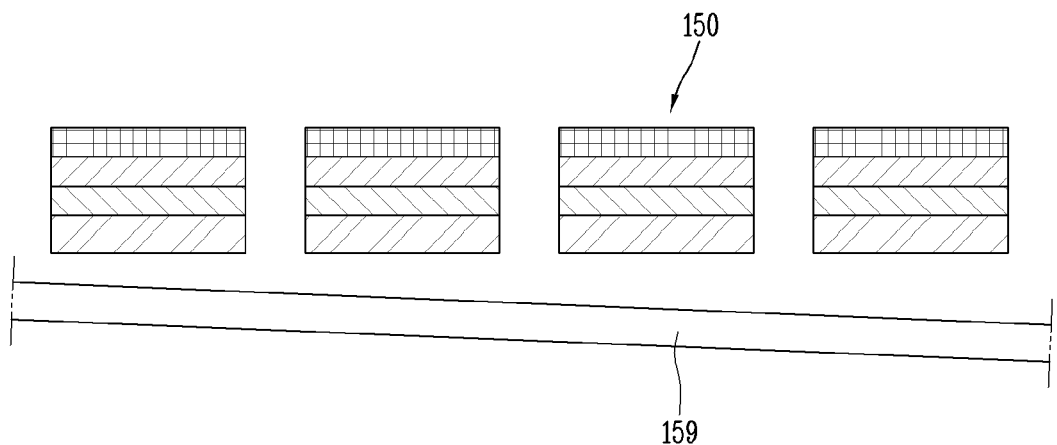

Next, the growth substrate 159 may be removed, thus leaving a plurality of semiconductor light-emitting elements. For example, the growth substrate 159 may be removed using laser lift-off (LLO) or chemical lift-off (CLO) (FIG. 5D).

Figure 5E:
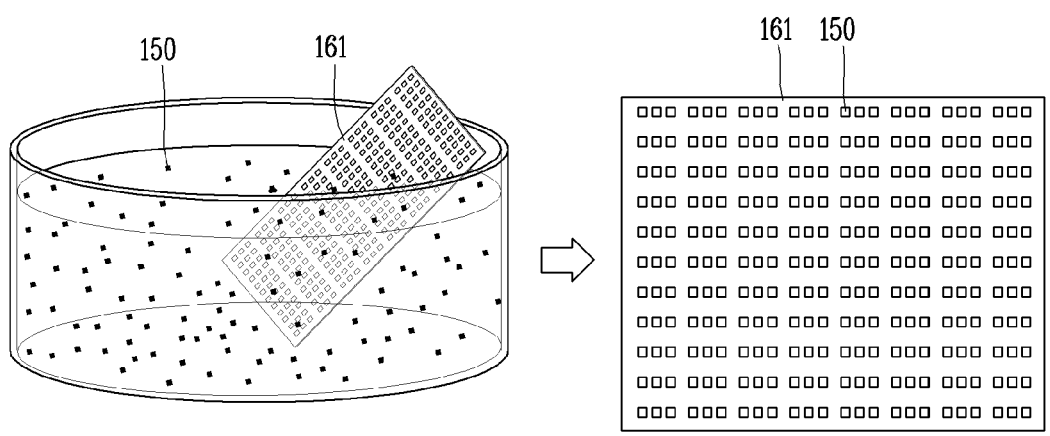

Afterwards, the step of mounting the semiconductor light-emitting elements 150 on a substrate 161 in a chamber filled with a fluid may be performed (FIG. 5E).

For example, the semiconductor light-emitting elements 150 and the substrate 161 may be put into a chamber filled with a fluid, and the semiconductor light-emitting elements may be self-assembled onto the substrate 161 using fluidity, gravity, surface tension, etc. In this case, the substrate may be an assembly substrate 161.

In another example, a wiring substrate, instead of the assembly substrate 161, may be put into a fluid chamber, and the semiconductor light-emitting elements 150 may be mounted directly onto the wiring substrate. In this case, the substrate may be a wiring substrate. For convenience of explanation, the present disclosure is illustrated with an example in which the semiconductor light-emitting elements 150 are mounted onto the assembly substrate 161.

To facilitate the mounting of the semiconductor light-emitting elements 150 onto the assembly substrate 161, cells (not shown) into which the semiconductor light-emitting elements 150 are fitted may be provided on the assembly substrate 161. Specifically, cells where the semiconductor light-emitting elements 150 are mounted may be disposed on the assembly substrate 161 at positions where the semiconductor light-emitting elements 150 are aligned with wiring electrodes. The semiconductor light-emitting elements 150 may be assembled to the cells as they move within the fluid.

After arraying the semiconductor light-emitting elements 150 on the assembly substrate 161, the semiconductor light-emitting elements 150 may be transferred to the wiring substrate from the assembly substrate 161, thereby enabling a large-area transfer across a large area. Thus, the assembly substrate 161 may be referred to as a temporary substrate.

Meanwhile, the above-explained self-assembly method requires a higher transfer yield so that it can be applied to the manufacture of large-screen displays. The present disclosure proposes a method and device that minimizes the effects of gravity or friction and avoids non-specific binding, in order to increase the transfer yield.

In this case, in the display device according to the present disclosure, a magnetic material may be placed on the semiconductor light-emitting elements so that the semiconductor light-emitting elements are moved by magnetic force, and the semiconductor light-emitting elements may be mounted at preset positions by an electric field in the process of being moved. This transfer method and device will be described in more detail below with reference to the accompanying drawings.

Figure 6:
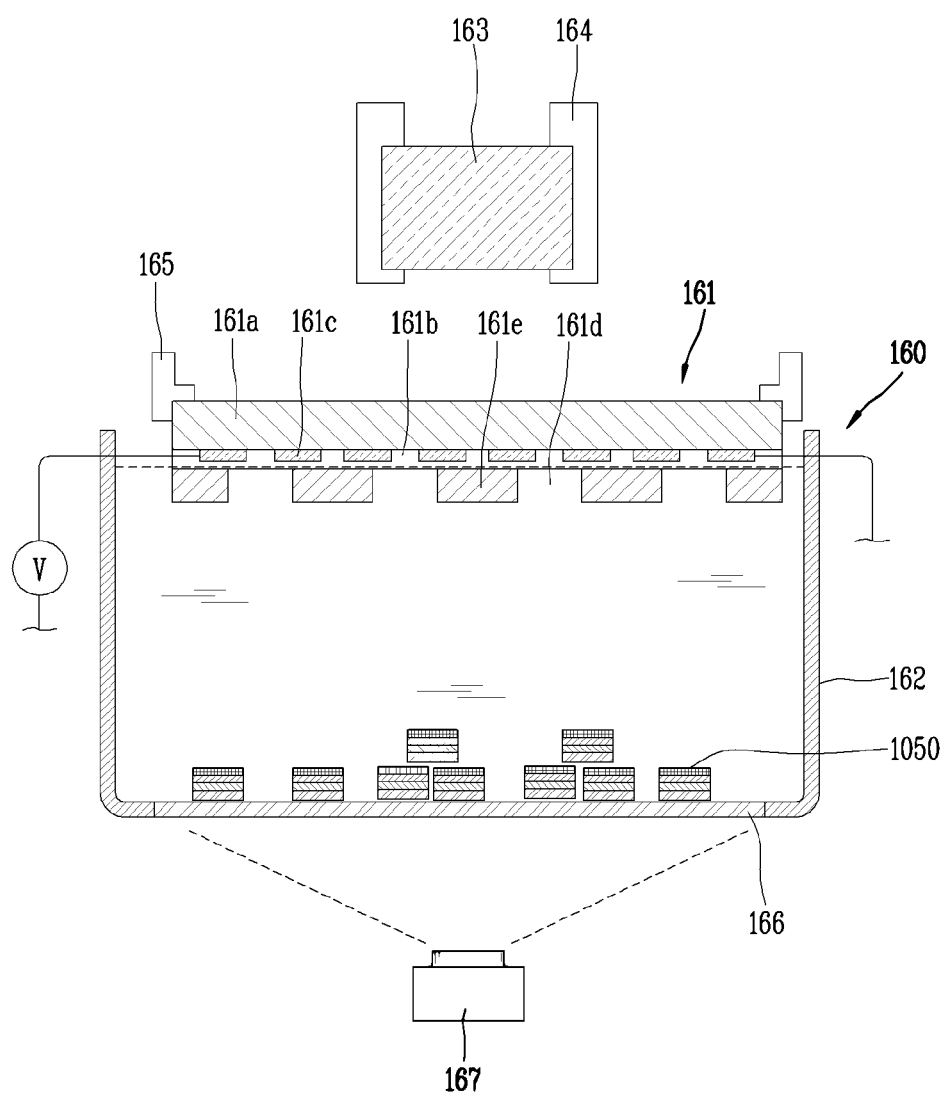
FIG. 6 is a conceptual diagram illustrating an example of a device for self-assembling semiconductor light-emitting elements.
Figure 7:
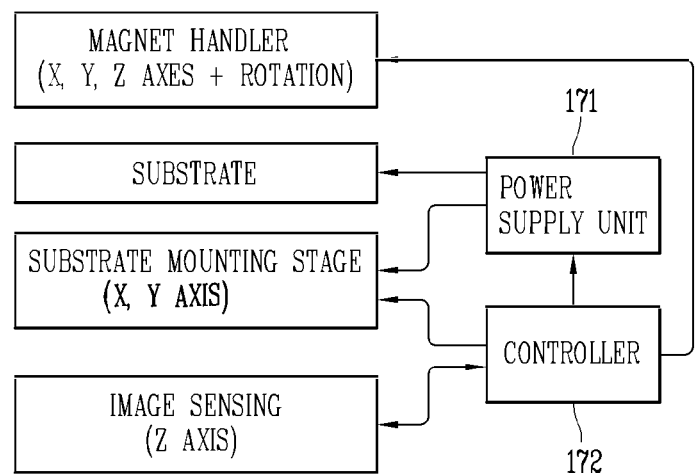
FIG. 7 is a block diagram of the self-assembly device of FIG. 6.

FIG. 6 is a conceptual diagram illustrating an example of a device for self-assembling semiconductor light-emitting elements and FIG. 7 is a block diagram of the self-assembly device of FIG. 6. FIGS. 8A to 8E are conceptual view illustrating a process for self-assembling semiconductor light-emitting elements using the self-assembly device of FIG. 6 and FIG. 9 is a conceptual view illustrating the semiconductor light-emitting element of FIGS. 8A to 8E.

Referring to FIGS. 6 and 7, the self-assembly device 160 may include a fluid chamber 162, a magnet 163, and a position controller 164.

The fluid chamber 162 may define a space for receiving a plurality of semiconductor light-emitting elements. The space may be filled with a fluid, and the fluid may be an assembly solution, which includes water or the like. Thus, the fluid chamber 162 may be a water tank and configured as an open-type. However, the present disclosure is not limited to this, and the fluid chamber 162 may be a closed-type chamber in which the space is in a closed state.

A substrate 161 may be placed in the fluid chamber 162 so that an assembly surface where the semiconductor light-emitting elements 150 are assembled faces downwards. For example, the substrate 161 may be fed to an assembly site by a feed unit (transfer unit), and the transfer unit may include a stage 165 where the substrate is mounted. The position of the stage 165 may be adjusted by the controller, whereby the substrate 161 can be fed to the assembly site.

In this instance, the assembly surface of the substrate 161 at the assembly site may face the bottom of the fluid chamber 162. As illustrated in the drawings, the assembly surface of the substrate 161 may be placed to be soaked with the fluid in the fluid chamber 162. Thus, the semiconductor light-emitting elements 150 in the fluid may be moved to the assembly surface.

The substrate 161 may be an assembly substrate where an electric field can be formed, and may include a base portion 161a, a dielectric layer 161b, and a plurality of electrodes 161c.

The base portion 161a may be made of an insulating material, and the plurality of electrodes 161c may be thin-film or thick-film bi-planar electrodes that are patterned on one surface of the base portion 161a. The electrodes 161c may be formed of a stack of Ti/Cu/Ti, Ag paste, ITO, etc.

The dielectric layer 161b may be made of an inorganic material such as SiO2, SiNx, SiON, Al2O3, TiO2, HfO2, etc. Alternatively, the dielectric layer 161b may be an organic insulator and configured as a single layer or multi-layers. The thickness of the dielectric layer 161b may range from several tens of nm to several μm.

Further, the substrate 161 according to the present disclosure may include a plurality of cells 161d that are separated by barrier walls (or partition parts) 161e. The cells 161d may be sequentially arranged in one direction and made of polymer material. Also, the barrier walls 161e defining the cells 161d may be shared by neighboring cells 161d. The barrier walls 161e may protrude from the base portion 161a, and the cells 161d may be sequentially arranged in one direction along the barrier walls 161e. More specifically, the cells 161d may be sequentially arranged in column and row directions and have a matrix configuration.

As illustrated in the drawings, the cells 161d may have recesses for receiving the semiconductor light-emitting elements 150, and the recesses may be spaces defined by the barrier walls 161e. The recesses may have a shape identical or similar to the shape of the semiconductor light-emitting elements. For example, if the semiconductor light-emitting elements are rectangular, the recesses may be rectangular too. Moreover, although not shown, the recesses formed in the cells may be circular if the semiconductor light-emitting diodes are circular. Further, each cell may be configured to receive one semiconductor light-emitting element. That is, one cell may receive one semiconductor light-emitting element.

Meanwhile, the plurality of electrodes 161c may have a plurality of electrode lines that are placed at the bottom of the cells 161d, and the electrode lines may extend to neighboring cells.

The plurality of electrodes 161c may be placed beneath the cells 161d, and different polarities may be applied to create an electric field within the cells 161d. To form an electric field, the dielectric layer 161b may form the bottom of the cells 161d while covering the electrodes 161c. With this structure, when different polarities are applied to a pair of electrodes 161c beneath each cell 161d, an electric field may be formed and the semiconductor light-emitting elements can be inserted into the cells 161d by the electric field.

The electrodes of the substrate 161 at the assembly site may be electrically connected to a power supply 171. The power supply 171 may perform the function of generating the electric field by applying power to the electrodes.

As shown in the drawings, the self-assembly device may have the magnet 163 for applying magnetic force to the semiconductor light-emitting elements. The magnet 163 may be disposed at a distance from the fluid chamber 162 to apply magnetic force to the semiconductor light-emitting elements 150. The magnet 163 may be disposed to face an opposite side of the assembly surface of the substrate 161, and the position of the magnet 163 may be controlled by the position controller 164 connected to the magnet 163.

The semiconductor light-emitting elements 1050 may have a magnetic material so that they can be moved within the fluid by a magnetic field.

Referring to FIG. 9, a semiconductor light-emitting element having a magnetic material may include a first conductive electrode 1052, a second conductive electrode 1056, a first conductive semiconductor layer 1053 on which the first conductive electrode 1052 is disposed, a second conductive semiconductor layer 1055 which overlaps the first conductive semiconductor layer 1052 and on which the second conductive electrode 1056 is disposed, and an active layer 1054 disposed between the first and second conductive semiconductor layers 1053 and 1055.

Here, the first conductive may refer to p-type, and the second conductive type may refer to n-type, or vice versa. As stated previously, the semiconductor light-emitting diode may be formed without the active layer.

Meanwhile, the first conductive electrode 1052 may be formed after the semiconductor light-emitting element is assembled onto the wiring substrate by the self-assembling of the semiconductor light-emitting element. Further, the second conductive electrode 1056 may include a magnetic material. The magnetic material may refer a magnetic metal. The magnetic material may be Ni, SmCo, etc. In another example, the magnetic material may include at least one of Gd-based, La-based, and Mn-based materials.

The magnetic material may be provided in the form of particles on the second conductive electrode 1056. Alternatively, one layer of a conductive electrode including a magnetic material may be made of the magnetic material. As an example, the second conductive electrode 1056 of the semiconductor light-emitting element 1050 may include a first layer 1056a and a second layer 1056b, as illustrated in FIG. 9. Here, the first layer 1056a may include a magnetic material, and the second layer 1056b may include a metal material other than the magnetic material.

As illustrated in the drawing, in this example, the first layer 1056a including the magnetic material may be disposed in contact with the second conductive semiconductor layer 1055. In this case, the first layer 1056a may be disposed between the second layer 1056b and the second conductive semiconductor layer 1055. The second layer 1056b may be a contact metal that is connected to the second electrode on the wiring substrate. However, the present disclosure is not necessarily limited to this, and the magnetic material may be disposed on one surface of the first conductive semiconductor layer.

Still referring to FIGS. 6 and 7, more specifically, on top of the fluid chamber of the self-assembly device, a magnet handler capable of automatically or manually moving the magnet 163 on the x, y, and z axes or a motor capable of rotating the magnet 163 may be provided. The magnet handler and motor may constitute the position controller 164. As such, the magnet 163 may rotate in a horizontal, clockwise, or counterclockwise direction with respect to the substrate 161.

Meanwhile, the fluid chamber 162 may be provided with a light-transmissive bottom plate 166, and the semiconductor light-emitting elements may be disposed between the bottom plate 166 and the substrate 161. An image sensor 167 may be disposed to face the bottom plate 166 so as to monitor the inside of the fluid chamber 162 through the bottom plate 166. The image sensor 167 may be controlled by a controller 172, and may include an inverted-type lens, CCD, etc. so as to observe the assembly surface of the substrate 161.

The self-assembly device may be configured to use a magnetic field and an electric field in combination. With this, the semiconductor light-emitting elements can be mounted at preset positions on the substrate by the electric field while being moved by changes in the position of the magnet. Hereinafter, the assembly process using the self-assembly device will be described in more detail.

First of all, a plurality of semiconductor light-emitting elements 1050 having a magnetic material may be formed through the process explained with reference to FIGS. 5A to 5C. In this case, the magnetic material may be deposited onto the semiconductor light-emitting elements in the process of forming the second conductive electrode of FIG. 5C.

Figure 8A:
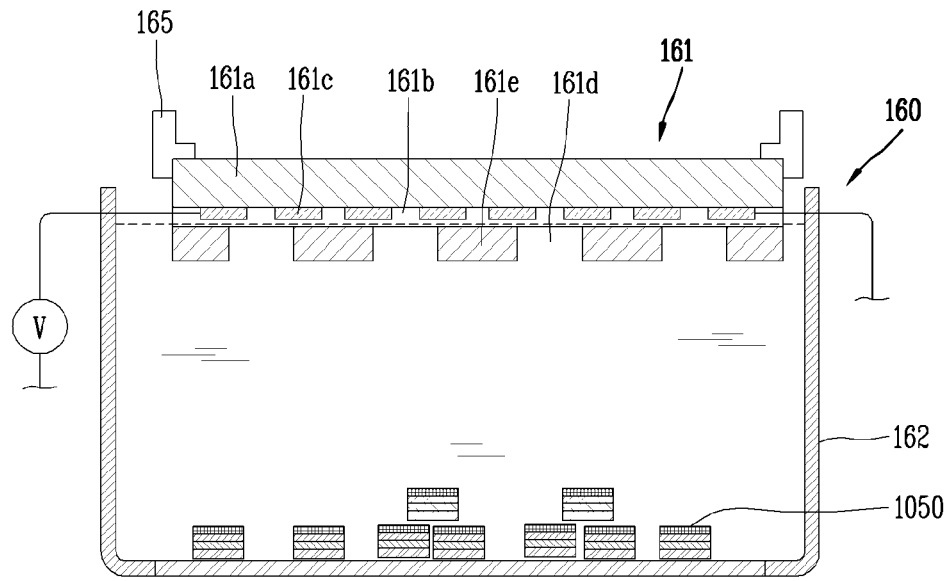
FIGS. 8A to 8E are conceptual view illustrating a process for self-assembling semiconductor light-emitting elements using the self-assembly device of FIG. 6.
Figure 9:
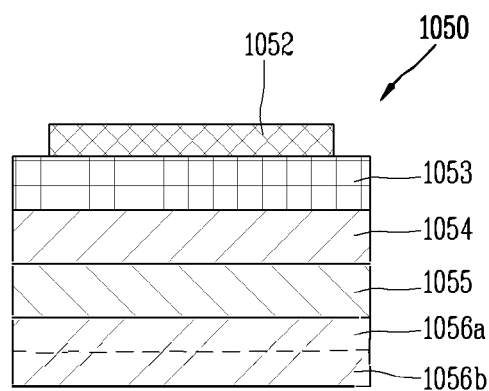
FIG. 9 is a conceptual view illustrating the semiconductor light-emitting element of FIGS. 8A to 8E.

Next, the substrate 161 may be fed to an assembly site, and the semiconductor light-emitting elements 1050 may be put into the fluid chamber 162 (FIG. 8A).

As described above, the assembly site on the substrate 161 may be a position at which the substrate 161 is placed in the fluid chamber 162 in such a way that an assembly surface where the semiconductor light-emitting elements 150 are assembled faces downwards.

In this case, some of the semiconductor light-emitting elements 1050 may sink to the bottom of the fluid chamber 162 and some of them may float in the fluid. When the fluid chamber 162 is provided with the light-transmissive bottom plate 166, some of the semiconductor light-emitting elements 1050 may sink to the bottom plate 166.

Figure 8B:
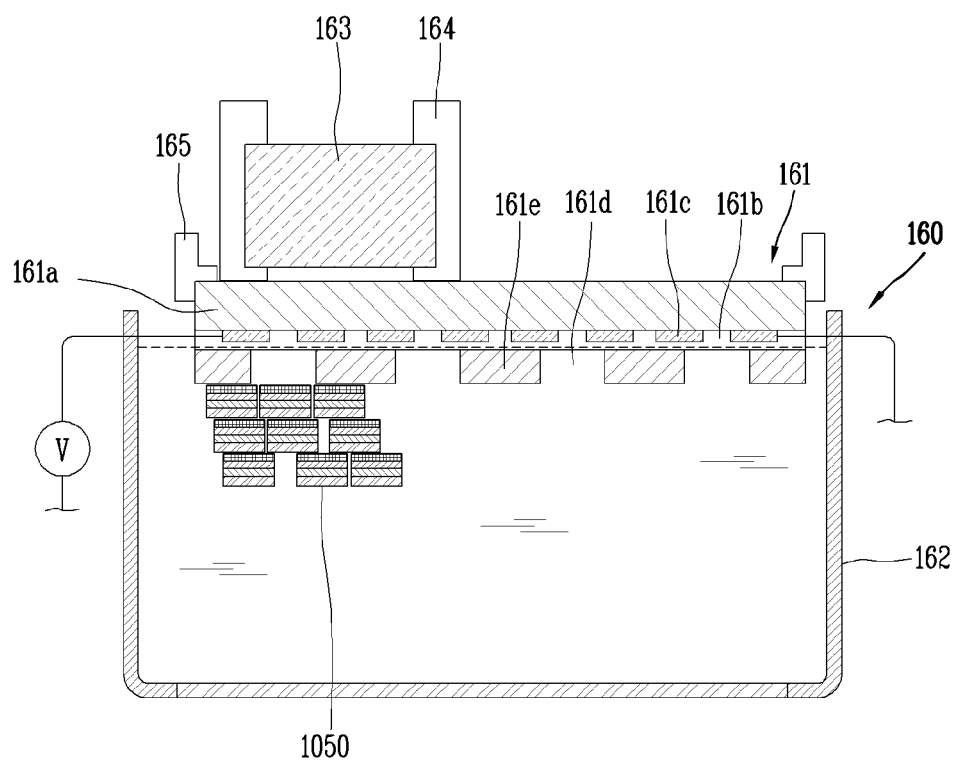

Next, magnetic force may be applied to the semiconductor light-emitting elements 1050 so that the semiconductor light-emitting elements 1050 in the fluid chamber 162 come up to the surface (FIG. 8B).

When the magnet 163 of the self-assembly device moves to the opposite side of the assembly surface of the substrate 161 from its original position, the semiconductor light-emitting elements 1050 may float in the fluid towards the substrate 161. The original position may refer to s position at which the magnet 163 is outside the fluid chamber 162. As another example, the magnet 163 may be configured as an electromagnet. In this case, an initial magnetic force may be generated by supplying electricity to the electromagnet.

Meanwhile, in this embodiment, the spacing between the assembly surface of the substrate 161 and the semiconductor light-emitting elements 1050 may be controlled by adjusting strength of the magnetic force. For example, the spacing may be controlled by using weight, buoyancy, and magnetic force of the semiconductor light-emitting elements 1050. The spacing may be several millimeters to several tens of micrometers from the outermost part of the substrate 161.

Figure 8C:
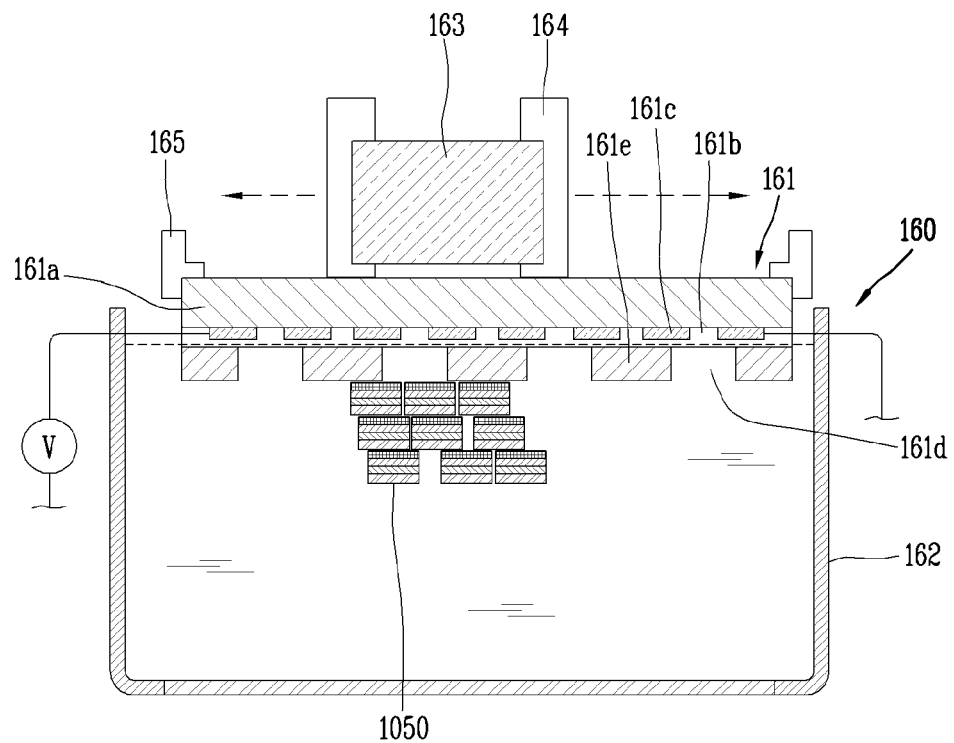

Next, magnetic force may be applied to the semiconductor light-emitting elements 1050 so that the semiconductor light-emitting elements 1050 can move in one direction within the fluid chamber 162. For example, the magnet 163 may move in a horizontal direction to the substrate, a clockwise direction, or a counterclockwise direction (FIG. 8C). In this case, the semiconductor light-emitting elements 1050 may be moved horizontally with respect to the substrate 161 by the magnetic force, with being spaced apart from the substrate 161.

Next, the semiconductor light-emitting elements 1050 may be guided to preset positions on the substrate 161 by applying an electric field so that the semiconductor light-emitting elements 1050 are mounted at the preset positions during their movement (FIG. 8C). For example, the semiconductor light-emitting elements 1050 may be moved vertically with respect to the substrate 161 by the electric field while being moved horizontally with respect to the substrate 161, thereby being placed at the preset positions of the substrate 161.

More specifically, an electric field may be generated by supplying power to bi-planar electrodes on the substrate 161, and the semiconductor light-emitting electrodes 1050 may be guided to be assembled only at the preset positions by the electric field. That is, the semiconductor light-emitting elements 1050 may be self-assembled at the assembly site on the substrate 161 by a selectively generated electric field. To this end, the substrate 161 may be provided with cells into which the semiconductor light-emitting elements 1050 are fitted.

Afterwards, unloading of the substrate 161 may be performed, thereby completing the assembly process. In a case where the substrate 161 is an assembly substrate, the assembled semiconductor light-emitting elements may be transferred onto a wiring substrate to carry out a subsequent process for realizing the display device, as described previously.

Figure 8D:
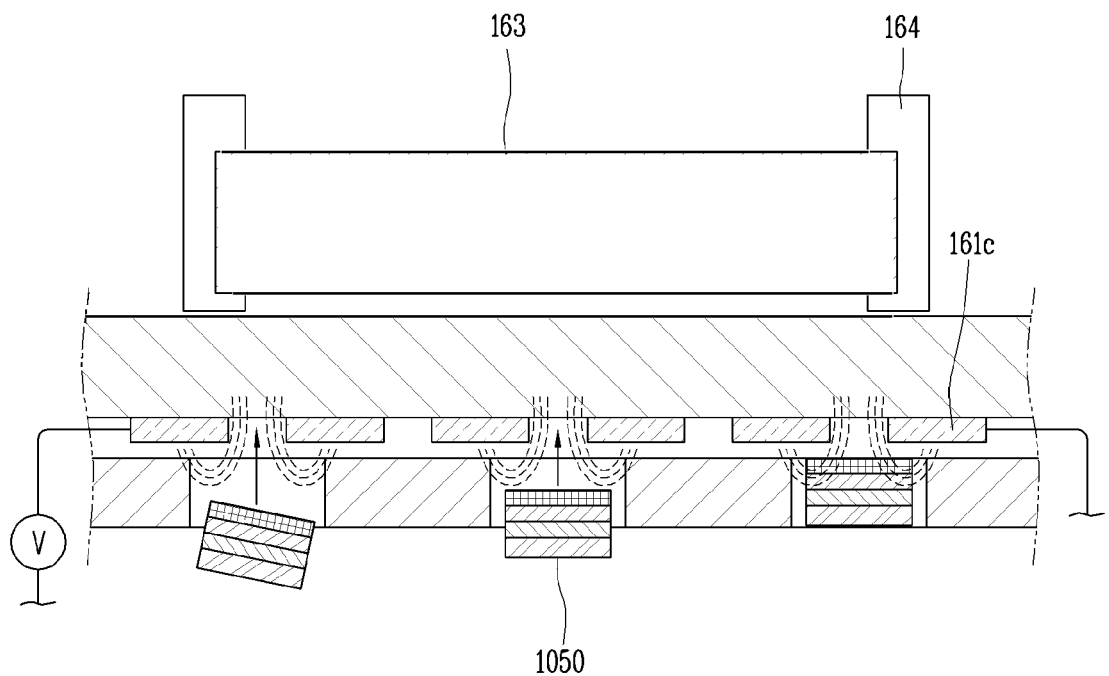
Figure 8E:
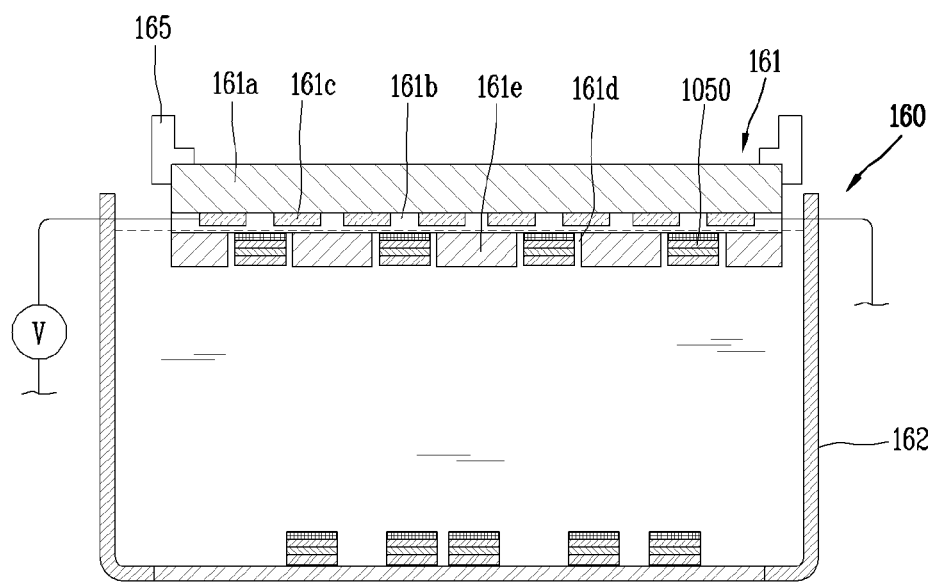

Meanwhile, after the semiconductor light-emitting elements 1050 are guided to the preset positions, the magnet 163 may be moved away from the substrate 161 such that the semiconductor light-emitting elements 1050 remaining in the fluid chamber 162 fall to the bottom of the fluid chamber 162 (FIG. 8D). In another example, when power supply is stopped in a case where the magnet 163 is an electromagnet, the semiconductor light-emitting elements 1050 remaining in the fluid chamber 162 may fall to the bottom of the fluid chamber 162.

Thereafter, the semiconductor light-emitting elements 1050 on the bottom of the fluid chamber 162 may be collected, and the collected semiconductor light-emitting elements 1050 may be re-used.

In the above-explained self-assembly device and method, parts at far distances may be concentrated near a preset assembly site by using a magnetic field in order to increase assembly yields in a fluidic assembly, and guided to be selectively assembled only at the assembly site by applying an electric field to the assembly site. In this case, the assembly substrate may be positioned on top of a water tank, with its assembly surface facing downward, thereby minimizing the effect of gravity from the weights of the parts and avoiding non-specific binding and eliminating defects. That is, the assembly substrate may be placed on the top to increase transfer yields, thus minimizing the effect of gravity or friction and avoiding non-specific binding.

As seen from above, with the configuration, a large number of semiconductor light-emitting elements can be assembled at a time in a display device where individual pixels are made up of semiconductor light-emitting elements.

As such, a large number of semiconductor light-emitting elements can be pixelated on a small-sized wafer and then transferred onto a large-area substrate. This enables the manufacture of a large-area display device at a low cost.

On the other hand, in order to commercialize the self-assembly method, accuracy of assembly should be secured and accordingly, a method for solving the mis-assembly of the semiconductor light-emitting elements 1050 is required.

FIG. 10 is a view illustrating mis-assembly types upon self-assembly. The semiconductor light-emitting elements 1050 are normally assembled by being placed at preset positions of the assembly substrate 161, i.e., in the cells 161*d*, by the self-assembly process described above ((d) of FIG. 10). However, some semiconductor light-emitting elements 1050 have failed to be accurately fitted in the cells 161d due to being caught on the barrier walls 161e surrounding the cells 161d in the process of being placed in the cells 161d ((a) of FIG. 10), or have been placed on other regions, not in the cells 161d, due to external leakage of an electric field holding the semiconductor light-emitting elements 1050 in the cells 161d ((b) of FIG. 10). In addition, the semiconductor light-emitting elements 1050 for the self-assembly have a structure in which selectivity of an assembling direction is secured by a difference in surface area. A surface with a wide surface area is generally placed in contact with the bottom surface of the cell 161d, but in some cases, the semiconductor light-emitting element 1050 may be assembled in an opposite direction ((d) of FIG. 10).

The present disclosure proposes a module for removing mis-assembled semiconductor light-emitting elements (hereinafter, referred to as a removal module) considering specificity of self-assembly in a fluid, and a method for removing a mis-assembled semiconductor light-emitting element using the same. Hereinafter, an implementation thereof will be described in more detail with reference to FIGS. 11 to 15.

Figure 13:
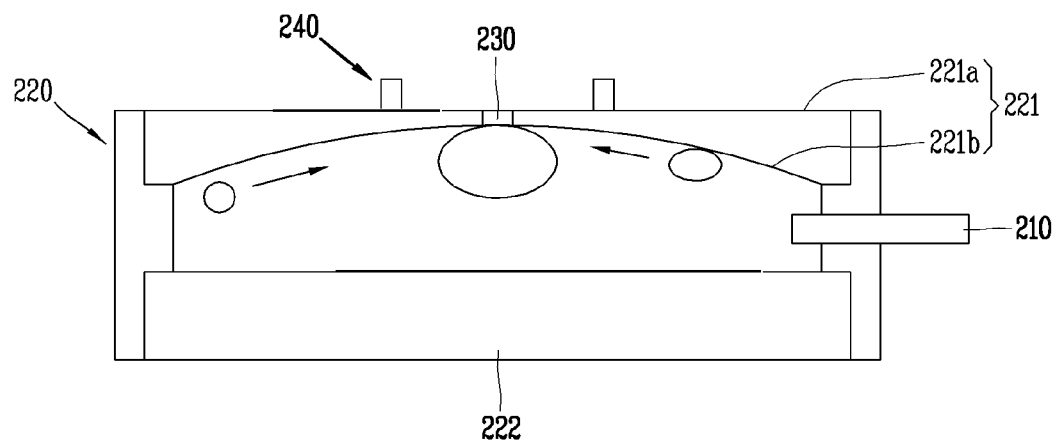
FIG. 13 is a view illustrating a removal module in accordance with an exemplary variation.

FIG. 11 is a view illustrating a removal module in accordance with one implementation, FIG. 12 is a view illustrating a removal module applied to a self-assembly device (fluid chamber), FIG. 13 is a view illustrating a removal module in accordance with an exemplary variation, and FIG. 14 is a view illustrating a removal module to which a color filter or a metal thin film layer is applied.

A removal module 200 according to an implementation may be used to remove the semiconductor light-emitting element 1050, which is mis-assembled on the assembly substrate 161, as illustrated in FIG. 10, after the semiconductor light-emitting elements 1050 introduced into a fluid filled in the chamber 162 are self-assembled into the cells 161d arranged in the matrix form on the assembly substrate 161 by using an electric field and a magnetic field. The removal module 200 may be disposed in the fluid chamber 162 to remove the mis-assembled semiconductor light-emitting element 1050 from the assembly substrate 161 in a manner of spraying (injecting) a fluid on a position of the mis-assembled semiconductor light-emitting element 1050.

The removal module 200 may include a fluid supply unit 210 for supplying a fluid and a housing 220.

The fluid supply unit 210 may be connected to one side of the housing 220 to supply a fluid to an inner space 224 of the housing 220. For example, the fluid supply unit 210 may be a fluid supply tube, and one end may be connected to the housing 220 through a joint portion 223 disposed at the one side of the housing 220 and another end may be connected to a fluid pump so as to receive a fluid to supply to the housing 220.

The housing 220 may include an inner space 224 in which the fluid supplied from the fluid supply unit 210 can temporarily stay, an upper plate 221 disposed at a side adjacent to the assembly substrate 161, and a lower plate 222 disposed at a side adjacent to a bottom surface of the fluid chamber 162. The housing 220 may have an integral form or may be formed by coupling detachable components.

In one example, the upper plate 221 and the lower plate 222 may be made of a transparent material such as glass or silicon, such that an alignment of the removal module 200 and a removal of a mis-assembled semiconductor light-emitting element 1050 can be monitored in real time through the image sensor 167 disposed below the fluid chamber 162, as illustrated in FIG. 6. However, even when the upper plate 221 and the lower plate 222 are not formed of a transparent material, a separate sensor may be additionally disposed to monitor the alignment of the removal module 200 and the mis-assembled state of the semiconductor light-emitting element 1050.

A nozzle hole 230 through which the inner space 224 of the housing 220 and an inner space of the chamber 162 communicate with each other may be formed through the upper plate 221. The nozzle hole 230 may spray (inject) the fluid supplied from the fluid supply unit 210 to a mis-assembly site of the semiconductor light-emitting element 1050 on the assembly substrate 161, so that the mis-assembled semiconductor light-emitting element 1050 can be removed from the assembly substrate 161.

The nozzle hole 230 may not be limited to any shape like a circular hole, a slit hole, etc., but may have a shape with its width that is uniform or getting narrow in an upward direction, as illustrated, depending on a material of the upper plate 221 or a process.

In addition, a pair of barrier walls (or partition parts) 240 facing each other based on the nozzle hole 230 may be disposed on the upper plate 221. The barrier walls 240 may be disposed near the nozzle hole 230, to block the fluid sprayed through the nozzle hole 230 from sputtering to regions adjacent to the mis-assembly site and thus prevent the affection of the fluid to the normally-assembled semiconductor light-emitting elements 1050.

The barrier walls 240 may include first barrier walls 241 and second barrier walls 242. Specifically, the barrier walls 240 may include a pair of first barrier walls 241 extending in a row direction of the semiconductor light-emitting elements 1050 arranged in the matrix configuration on the assembly substrate 161, and a pair of second barrier walls 242 extending in a column direction.

The semiconductor light-emitting elements 1050 may be arranged in a plurality of rows and columns on the assembly substrate 161, and may be arranged at intervals of several tens to several hundreds of μm along the plurality of rows and columns. For example, the semiconductor light-emitting elements 1050 may be arranged in the row direction at intervals of several tens of μm, and may be arranged in the column direction at intervals of several hundreds of μm.

In this case, the first barrier walls 241 may have an interval which is equal to or narrower than an interval between the semiconductor light-emitting elements 1050 in the column direction and the second barrier walls 242 may have an interval equal to or narrower than an interval between the semiconductor light-emitting elements 1050 in the row direction. Here, the interval between the semiconductor light-emitting elements 1050 in the column or row direction may refer to a distance between centers of two adjacent semiconductor light-emitting elements 1050 in the column or row direction. That is, the first barrier walls 241 and the second barrier walls 242 may isolate the mis-assembly site from regions adjacent to the semiconductor light-emitting elements 1050 arranged in the row or column direction. Accordingly, a region, which is affected by the fluid sprayed through the nozzle hole 230 surrounded by the first barrier walls 241 and the second barrier walls 242, can be limited to the mis-assembly site.

In addition, the first barrier walls 241 extending along the row direction of the semiconductor light-emitting element 1050 may extend longer than at least a length of the cell 161d in the row direction in which the semiconductor light-emitting element 1050 is fitted. The second barrier walls 242 extending along the column direction of the semiconductor light-emitting element 1050 may extend longer than at least a length of the cell 161d in the column direction in which the semiconductor light-emitting element 161*d* is fitted. This can prevent the fluid sprayed through the nozzle hole 230 from sputtering to the semiconductor light-emitting elements 1050 normally assembled in the adjacent cells 161*d*.

Meanwhile, the removal module 200 may include a transfer unit 270 for position alignment. The transfer unit 270 may move the housing 220 in horizontal and vertical directions so that the removal module 200 correspond to a position of the semiconductor light-emitting element 1050 which is mis-assembled on the assembly substrate 161. The transfer unit 270 may be a general configuration used to align positions of equipment, and may include, for example, a transfer rail, a motor, and the like.

When the mis-assembly site is detected, the housing 220 may be horizontally moved on a virtual plane parallel to the assembly substrate 161 by the transfer unit 270 to be first aligned below the mis-assembly site and vertically moved close to the assembly substrate 161 to be finally aligned. Details regarding the alignment of the removal module 200 will be described later.

In some examples, air bubbles may be introduced into the inner space 224 of the housing 220 in the process of initially setting the removal module 200 in the chamber 162 and in the process of receiving the fluid. The introduced air bubbles may interfere with a smooth process of removing the mis-assembled semiconductor light-emitting element 1050 using the removal module 200.

Accordingly, according to another implementation, the upper plate 221 may have a modified structure as illustrated in FIG. 13 to remove air bubbles introduced into the housing 220.

In detail, the upper plate 221 may include a first surface 221*a* facing the assembly substrate 161 and a second surface 221*b* facing the inner space 224 of the housing 220. In order to remove the introduced air bubbles, the second surface 221*b* may have a convex shape toward the first surface 221*a*. That is, one surface of the upper plate 221 facing the inner space 224 of the housing 220 may be curved.

At this time, the nozzle hole 230 may allow the inner space 224 of the housing 220 and the inner space of the fluid chamber 162 to communicate with each other through the highest point of the second surface 221*b*. The structure may guide the air bubbles distributed in the housing 220 toward the highest point of the second surface 221*b*, so that the air bubbles can be removed together when the fluid is sprayed through the nozzle hole 230.

In some examples, the nozzle hole 230 may be formed in a size smaller than a size of the semiconductor light-emitting element 1050 which is several to several tens of µm, which causes a limit to accurately arranging the nozzle hole 230 at the mis-assembly site. In particular, it is more difficult to accurately align the nozzle hole 230 when the upper plate 221 is formed of a transparent material.

Accordingly, according to another implementation, in order to easily determine the position of the nozzle hole 230, the upper plate 221 may further include a color filter 250 or a metal thin film layer 260.

The color filter 250 may be disposed on the upper plate 221 and a fine hole (not shown) may be formed at a position corresponding to the nozzle hole 230. Specifically, the color filter 250 may be disposed on the upper plate 221 such that the fine hole (not shown) formed through the color filter 250 and the nozzle hole 230 formed through the upper plate 221 overlap each other. The nozzle hole 230 can be distinguished from a peripheral region, which is identified by a specific color, by the fine hole (not shown), and the fluid sprayed through the nozzle hole 230 can spray onto the mis-assembly site via the fine hole (not shown) of the color filter 250.

In addition, the metal thin film layer 260 may be formed in a sputtering manner along a circumference of the nozzle hole 230 formed through the upper plate 221. The nozzle hole 230 may be easily identified by the colored metal thin film layer 260.

In some examples, the upper plate 221 may include both the color filter 250 and the metal thin film layer 260. In addition, depending on the shape of the upper plate 221 (e.g., when the upper plate 221 is flat), the color filter 250 and the metal thin film layer 260 may be formed at either a surface of the upper plate 221 facing the assembly substrate 161 or a surface facing the inner space 224 of the housing 220. However, when the surface of the upper plate 221 facing the inner space 224 of the housing 220 has a convex shape, the color filter 250 and the metal thin film layer 260 may preferably be formed at the surface facing the assembly plate 161.

As described above, the removal module 200 according to the implementation can be disposed in the fluid chamber 162 to selectively remove the mis-assembled semiconductor light-emitting element 1050 by spraying a fluid onto a specific site of the assembly substrate 161, on which the semiconductor light-emitting elements 1050 having a size of several to several tens of µm are arranged at intervals of several tens to several hundreds of µm by the self-assembly.

In addition, since the mis-assembly site is isolated from the adjacent cells 161*d* by the barrier walls 240, the semiconductor light-emitting elements 1050 normally assembled at the adjacent regions can be prevented from being separated by the fluid sprayed through the nozzle hole 230.

In addition, since the upper plate 221 has the convex surface, air bubbles generated in the housing 220 can also be removed through the nozzle hole 230 when spraying the fluid. The color filter 250 or the metal thin film layer 260 can be provided to facilitate identification of the fine nozzle hole 230, such that the nozzle hole 230 can be aligned at an accurate position.

Hereinafter, a method for removing the semiconductor light-emitting element 1050 mis-assembled on the assembly substrate 161, as a post-process of self-assembly, using the removal module 200 will be described.

FIGS. 15A to 15E are conceptual diagrams illustrating a method for removing a mis-assembled semiconductor light-emitting element using a removal module according to an implementation.

A process for removing a mis-assembled semiconductor light-emitting element is a process performed after self-assembly is completed. Here, the self-assembly means placing the semiconductor light-emitting elements 1050 introduced into the fluid in preset positions of the assembly substrate 161, namely, in the cells 161*d* using an electric field and a magnetic field.

The semiconductor light-emitting elements 1050 floating in the fluid may be moved into the cells 161*d* by an electric field and a magnetic field applied from the assembly substrate 161 and the upper side of the assembly substrate 161. In this process, some semiconductor light-emitting elements 1050 may not be assembled normally as illustrated in FIG. 10.

The present disclosure relates to a method for removing a semiconductor light-emitting element 1050 mis-assembled on the assembly substrate 161 using the removal module 200. Hereinafter, each step constituting the method will be described in detail.

Figure 15A:
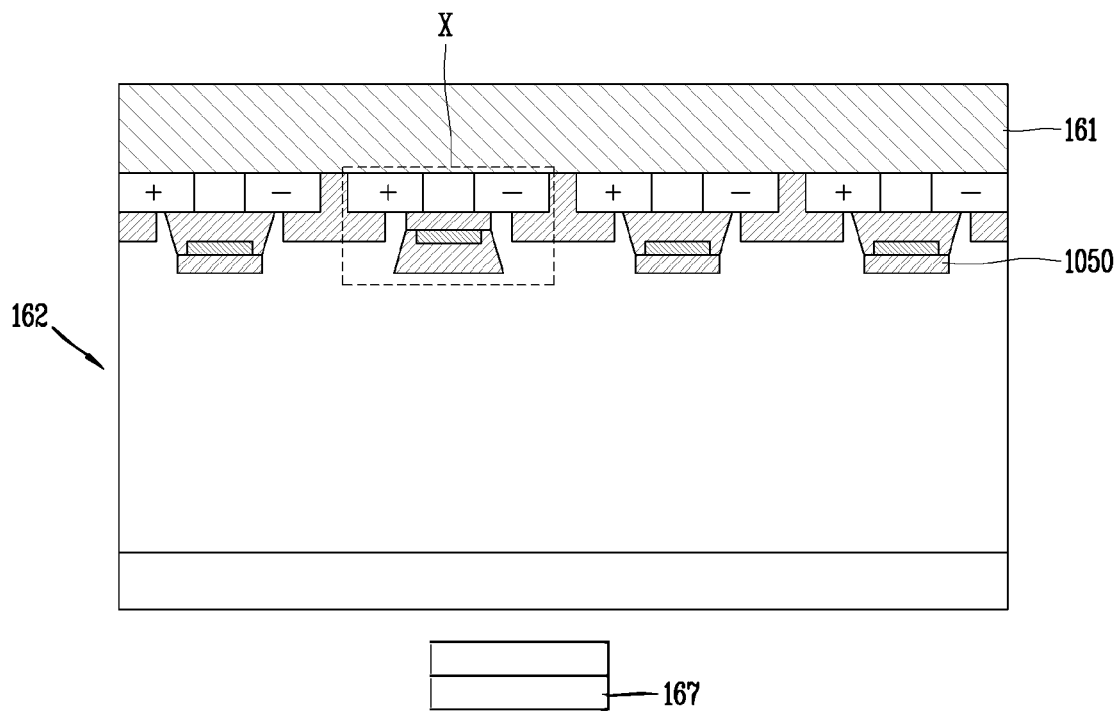
FIGS. 15A to 15E are conceptual views illustrating a method for removing a mis-assembled semiconductor light-emitting element using a removal module according to an implementation.

First, as illustrated in FIG. 15A, an image or a video of one surface of the completely self-assembled assembly substrate 161 (a surface facing the bottom surface of the fluid chamber 162 and having the semiconductor light-emitting element 1050 placed thereon) may be captured using the image sensor 167 disposed outside the fluid chamber 162. Whether there is a mis-assembled semiconductor light-emitting element and coordinates of a position of the mis-assembled semiconductor light-emitting element 1050 may be checked from the image or video.

For example, in the case of FIG. 15A, presence of a semiconductor light-emitting element 1050 that has been placed in a different direction may be identified on the captured image or video, and coordinates of the corresponding cell (hereinafter, mis-assembly site X) can also be identified. The cells 161d on which the semiconductor light-emitting elements 1050 are placed may be formed in the matrix configuration on the assembly substrate 161, and the semiconductor light-emitting elements 1050 may be arranged in the matrix configuration on the assembly substrate 161. Therefore, the coordinates of the position of the mis-assembly site X can be indicated by coordinates (x, y) of row and column.

Figure 15B:
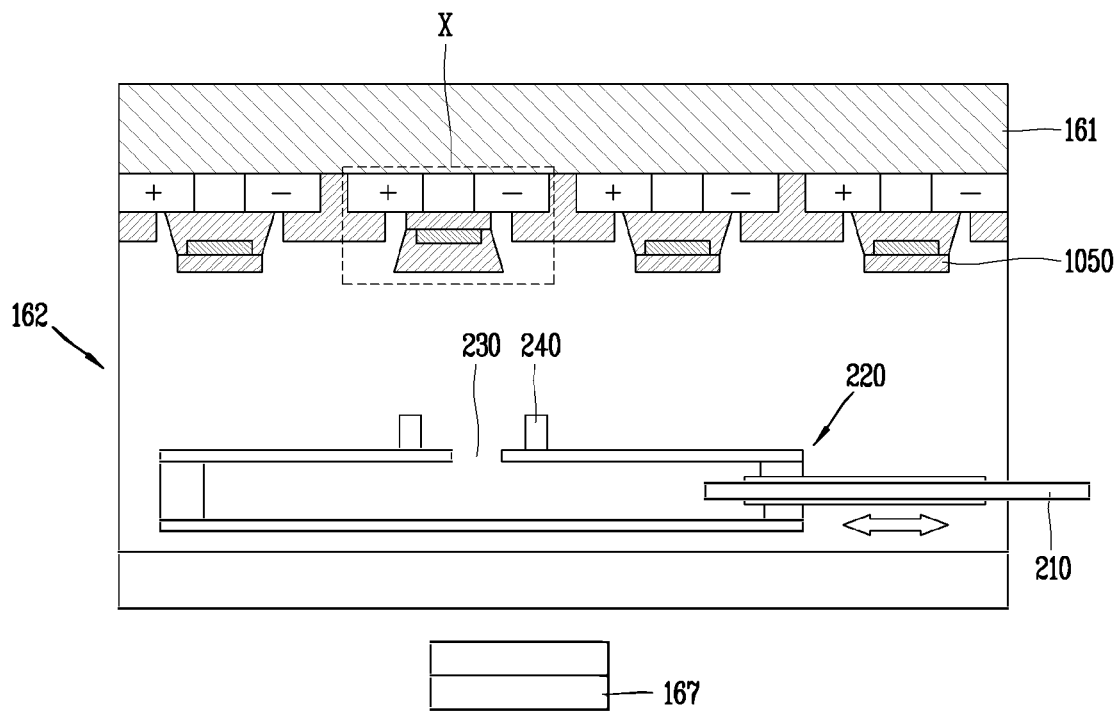
Figure 15C:
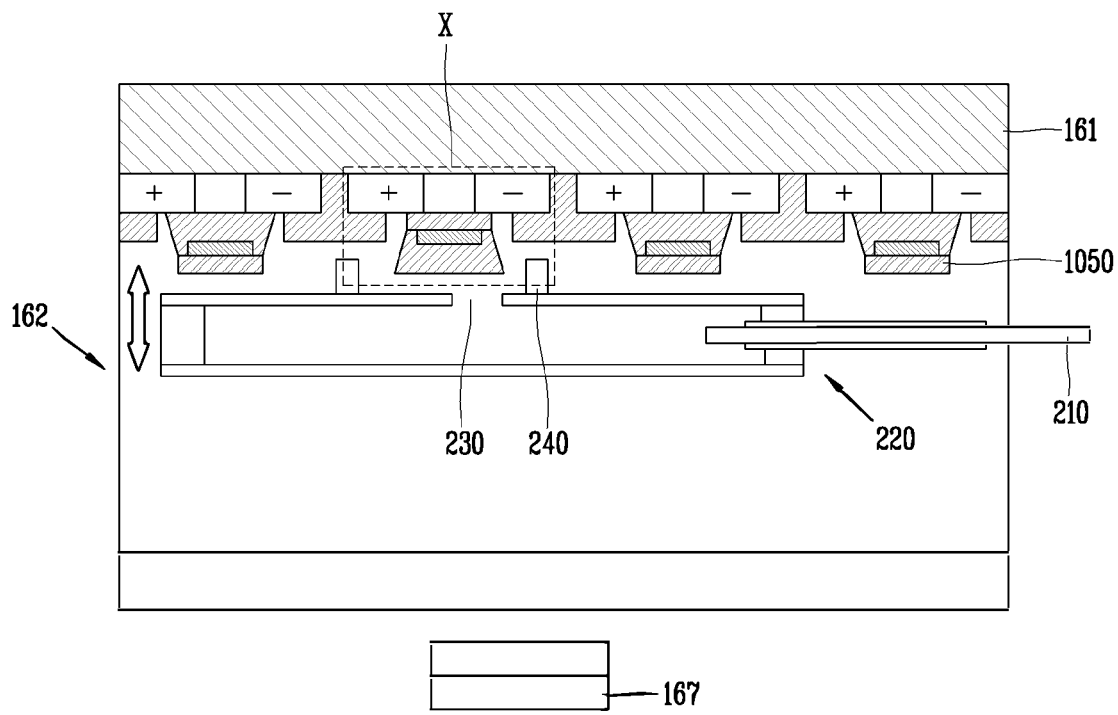
Figure 15D:
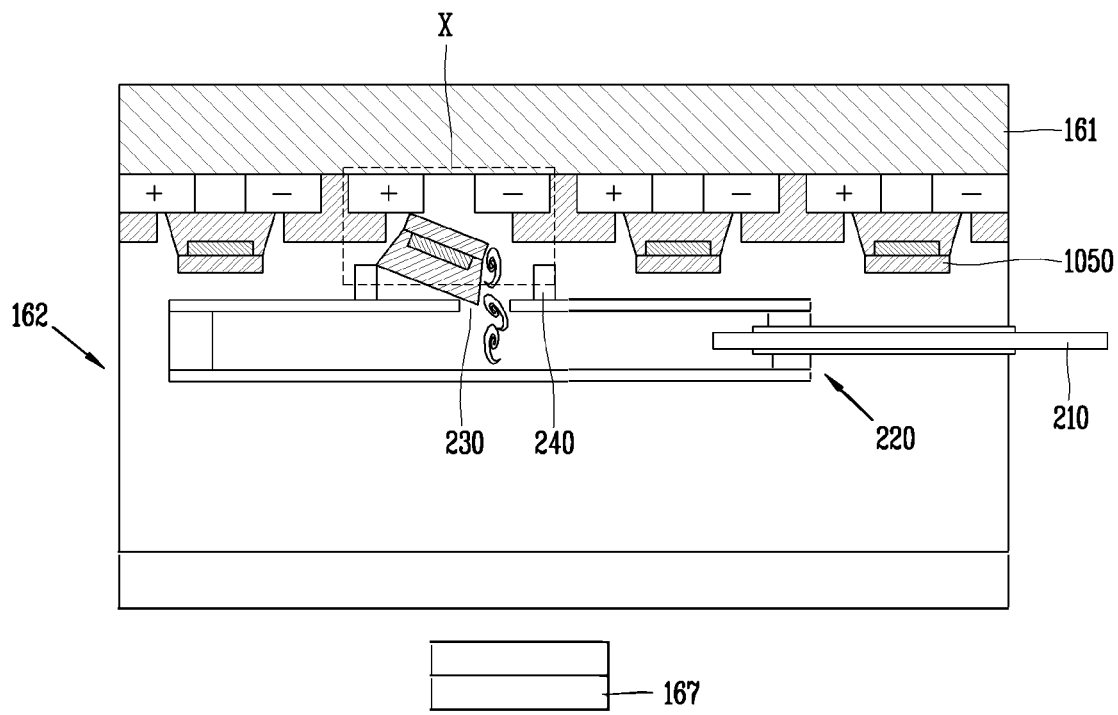
Figure 15E:
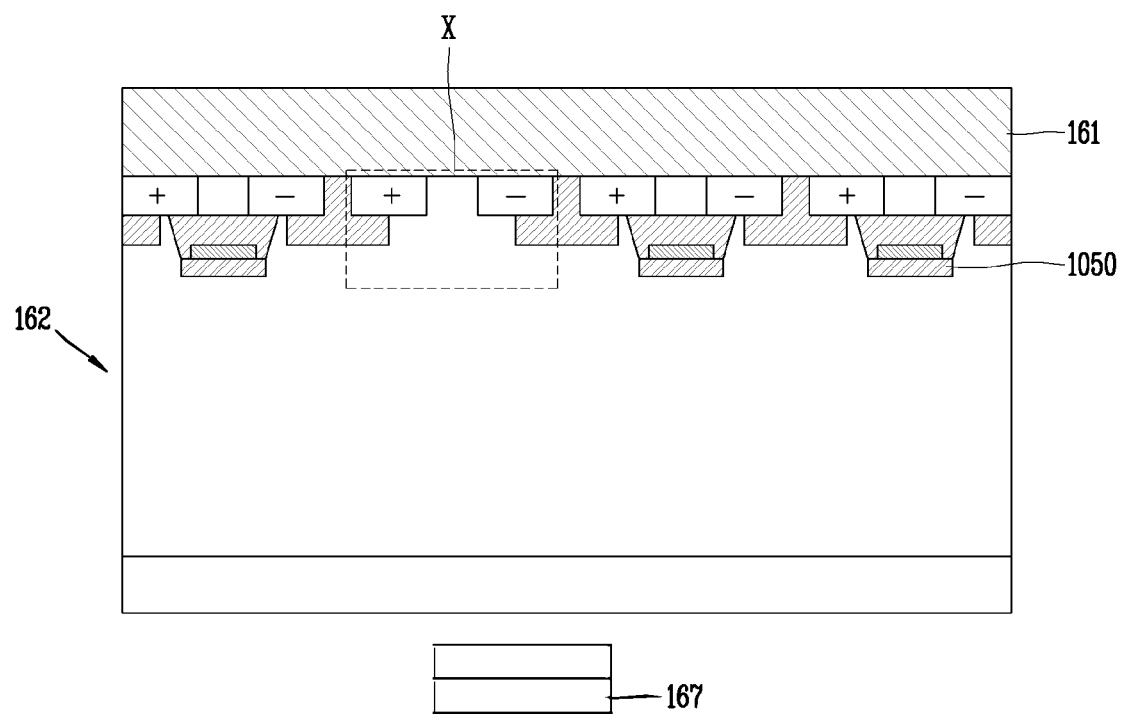

After identifying the coordinates of the position of the mis-assembly site X, the removal module 200 may be put into the fluid chamber 162, to be located below a point corresponding to the identified coordinates of the position, as illustrated in FIGS. 15B and 15C. The removal module 200 may be moved horizontally and vertically to be aligned at a position for spraying the fluid.

First, as illustrated in FIG. 15B, the removal module 200 may be horizontally moved so that the position coordinates (x, y) of the nozzle hole 230 of the removal module 200 for spraying the fluid and the mis-assembly site X correspond to each other. Horizontal movement may mean movement on a virtual horizontal plane (xy plane) parallel to the assembly substrate 161, and horizontal movement may correspond to movement for aligning the position of the mis-assembly site X and the position of the removal module 200.

Next, when the horizontal movement is completed, as illustrated in FIG. 15C, the vertical movement of the removal module 200 may be made. The vertical movement may be movement to make one end of each barrier wall 240 of the removal module 200 closer to one surface of the assembly substrate 161, and may be continued until the one end of each barrier wall 240 is in contact with or adjacent to the assembly substrate 161. The mis-assembly site X may be isolated from adjacent regions by the barrier walls 240, and a region affected by the fluid injected through the nozzle hole 230 may be limited to a region surrounded by the barrier walls 240.

Next, the fluid may be sprayed on the mis-assembled position of the semiconductor light-emitting element 1050, namely, the mis-assembly site X, to remove the mis-assembled semiconductor light-emitting element 1050 from the assembly substrate 161. The fluid can be sprayed through the nozzle hole 230 toward an arbitrary region within the mis-assembly site X, for example, on a gap defined between the semiconductor light-emitting element 1050 and the cell 161d.

When the mis-assembled semiconductor light-emitting element 1050 is removed from the assembly substrate 161 through those steps (FIG. 15E), the semiconductor light-emitting element 1050 may be re-assembled to the corresponding position.

Meanwhile, when there are a plurality of semiconductor light-emitting elements 1050 on the assembly substrate 161, a single or two or more removal modules 200 may be used to remove the mis-assembled semiconductor light-emitting elements 1050.

Specifically, when one removal module 200 is used, the removal module 200 may identify coordinates of positions of a plurality of mis-assembly sites X obtained from a captured image or video, calculate a shortest path based on the respective coordinates, and move along the calculated shortest path.

On the other hand, when two or more removal modules 200 are used, the removal modules 200 may be located below the plurality of mis-assembly sites X, respectively, spray the fluid simultaneously onto the mis-assembly sites X, and remove the mis-assembled semiconductor light-emitting elements 1050. At this time, the plurality of removal modules 200 may be provided in the same number as the number of mis-assembly sites X. When the number of removal modules 200 is smaller than the number of mis-assembly sites X, those removal modules 200 may be arranged below arbitrary mis-assembly sites X in consideration of a shortest path calculated from coordinates of the mis-assembly sites X.

As described above, as a post-process of a self-assembly process within the fluid chamber 162 in which the self-assembly is carried out, the step of removing the semiconductor light-emitting elements 1050 mis-assembled on the assembly substrate 161 can be performed, thereby securing a process yield for manufacturing a display device.

It should be understood that the present disclosure is not limited to the configuration and method of the implementations described above but part or all of the implementations are selectively combined so that various modifications can be made.

What is claimed is:

1. A module for removing a mis-assembled semiconductor light-emitting element from an assembly substrate where the mis-assembled semiconductor light-emitting element was introduced into a fluid accommodated in a chamber and self-assembled to the assembly substrate by using an electrical field and a magnetic field, the module comprising:
a fluid supply unit configured to supply fluid; and
a housing having an inner space configured to store the fluid supplied by the fluid supply unit, wherein the housing includes an upper plate configured to face the assembly substrate and comprising:
a nozzle hole configured to spray the fluid supplied from the fluid supply unit toward the mis-assembled semiconductor light-emitting element on the assembly substrate; and
at least one pair of partition parts with the nozzle hole positioned therebetween.

2. The module of claim 1, wherein the at least one pair of partition parts comprises:
a pair of first partition parts extending parallel to a row direction of semiconductor light-emitting elements arranged on the assembly substrate; and
a pair of second partition parts extending parallel to a column direction of the semiconductor light-emitting elements arranged on the assembly substrate.

3. The module of claim 2, wherein a first separation distance of the pair of first partition parts is less than or equal to an interval distance between the semiconductor light-emitting elements arranged along the column direction, and a second separation distance of the pair of second partition parts is less than or equal to an interval distance between the semiconductor light-emitting elements arranged along the row direction.

4. The module of claim 2, wherein each of the pair of first partition parts extend longer than at least a length of a cell of the assembly substrate in the row direction, and each of the pair of second partition parts extend longer than at least a length of the cell of the assembly substrate in the column direction.

5. The module of claim 1, wherein the upper plate further comprises:
an inner surface facing the inner space of the housing and having a concave surface,
wherein the nozzle hole is positioned at a highest point of the concave surface.

6. The module of claim 1, wherein the upper plate further comprises a color filter having a fine hole formed at a position corresponding to the nozzle hole.

7. The module of claim 1, wherein the upper plate further comprises a metal thin film layer formed along a circumference of the nozzle hole.

8. The module of claim 1, further comprising a transfer unit configured to transfer the housing to correspond to a position of the mis-assembled semiconductor light-emitting element.

9. A method for removing a mis-assembled semiconductor light-emitting element from an assembly substrate where the mis-assembled semiconductor light-emitting element was introduced into a fluid accommodated in a chamber and self-assembled to the assembly substrate using an electric field and a magnetic field, the method comprising:
capturing an image or video of the assembly substrate on which semiconductor light-emitting elements are assembled;
identifying coordinates of a mis-assembled semiconductor light-emitting element based on the captured image or video;
aligning a removal module to a position corresponding to the identified coordinates, wherein the removal module comprises a fluid supply unit configured to supply fluid, an inner space connected to the fluid supply unit, and an upper plate configured to face the assembly module, wherein the upper plate comprises: a nozzle hole configured to spray the fluid supplied from the fluid supply unit toward the assembly substrate, and at least one pair of partition parts with the nozzle hole positioned therebetween; and
removing the mis-assembled semiconductor light-emitting element from the assembly substrate using the removal module by spraying the fluid toward the mis-assembled semiconductor light-emitting element.

10. The method of claim 9, wherein the aligning the removal module to the position corresponding to the identified coordinates comprises:
laterally moving the removal module so that the nozzle hole is located at the identified coordinates; and
moving the removal module toward the assembly substrate such that the at least one pair of partition parts is positioned closely to a surface of the assembly substrate to prevent the fluid from being sprayed to adjacent semiconductor light-emitting elements.

11. The method of claim 9, wherein based on identifying multiple coordinates corresponding to a plurality of mis-assembled semiconductor light-emitting elements, the method further comprises calculating a shortest path based on coordinates of each of the plurality of mis-assembled semiconductor light-emitting elements and moving the removal module along the calculated shortest path.

12. The method of claim 9, wherein based on identifying multiple coordinates corresponding to a plurality of mis-assembled semiconductor light-emitting elements, the method further comprises moving a plurality of removal modules to be aligned to positions respectively corresponding to the multiple identified coordinates so as to simultaneously remove the plurality of mis-assembled semiconductor light-emitting elements.

* * * * *